United States Patent
Wells et al.

(10) Patent No.: US 11,428,964 B2
(45) Date of Patent: *Aug. 30, 2022

(54) TRANSPARENT PHASE CHANGE ACTUATOR

(71) Applicant: Meta Platforms Technologies, LLC, Menlo Park, CA (US)

(72) Inventors: Spencer Allan Wells, Seattle, WA (US); Katherine Marie Smyth, Seattle, WA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/545,882

(22) Filed: Aug. 20, 2019

(65) Prior Publication Data

US 2021/0055580 A1 Feb. 25, 2021

(51) Int. Cl.
*G02F 1/03* (2006.01)
*G02F 1/055* (2006.01)

(52) U.S. Cl.
CPC .......... *G02F 1/0316* (2013.01); *G02F 1/0551* (2013.01); *G02F 1/0555* (2013.01)

(58) Field of Classification Search
CPC .......... G02F 1/03; G02F 1/0316; G02F 1/055; G02F 1/0555; G02F 1/0551; G02F 1/13338; G06F 3/01; G06F 3/016; G06F 3/041; G06F 3/044; G06F 3/0412; C08G 79/025; C08G 79/08
USPC .................................. 359/290, 295, 240, 242
See application file for complete search history.

(56) References Cited

U.S. PATENT DOCUMENTS

| | | |
|---|---|---|
| 2011/0163403 A1 | 7/2011 | Bhatia et al. |
| 2019/0113977 A1 | 4/2019 | Kim et al. |
| 2020/0373476 A1* | 11/2020 | Wells .................... C04B 35/486 |

FOREIGN PATENT DOCUMENTS

| | | |
|---|---|---|
| GB | 1 241 221 A | 8/1971 |
| WO | 2017/193092 A1 | 11/2017 |

OTHER PUBLICATIONS

Viehland et al., "Anhysteretic field-induced rhombohedral to orthorhombic transformation in <110> oriented 0.7 Pb(Mg1/3Nb2/3)O3-0.3 PbTiO3 crystals", Journal of Applied Physics, vol. 92, No. 2, Dec. 15, 2002, pp. 7690-7692.

Zhou et al., "Anisotropic domain switching in Pb(Mg1/3Nb2/3)O3-0.30PbTiO3 single crystals with rhombohedral structure", Journal of the American Ceramic Society, vol. 101, Feb. 2018, pp. 3054-3064.

Zhou et al., "Anisotropic temperature-electric field phase diagrams and domain structure evolution in rhombohedral Mn-doped PIN-PMN-PT single crystals", The Royal Society of Chemistry, CrystEngComm, Aug. 2018, 11 pages.

(Continued)

*Primary Examiner* — Jie Lei
(74) *Attorney, Agent, or Firm* — FisherBroyles, LLP

(57) ABSTRACT

A transparent optical element may include a layer of an electroactive ceramic disposed between transparent electrodes, such that the electrodes are each oriented perpendicular to a non-polar direction of the ceramic layer. Optical properties of the optical element, including transmissivity, haze, and clarity may be improved by the application of a voltage to the electroactive ceramic, and an associated phase transformation.

20 Claims, 24 Drawing Sheets

(56) References Cited

OTHER PUBLICATIONS

Li et al., "Critical Property in Relaxor-PbTiO3 Single Crystals—Shear Piezoelectric Response", Advanced Functional Materials, vol. 21, 2011, pp. 2118-2128.
Zhou et al., "Domain switching and polarization fatigue in rhombohedral PIN-PMN-PT and Mn-doped PIN-PMN-PT single crystals", Mar. 31, 2019, 34 pages.
Liu et al., "Ferroelectric properties of [110], [001] and [111] poled relaxor single crystals: measurements and modeling", Acta Materialia, vol. 51, 2003, pp. 407-416.
Zhang et al., "High performance ferroelectric relaxor-PbTiO3 single crystals: Status and perspective", Journal of Applied Physics, vol. 111, 2012, 50 pages.
Wang et al., "Large field-induced-strain at high temperature in ternary ferroelectric crystals", Scientific Reports, 6:35120, Oct. 13, 2016, pp. 1-9.
Li et al., "Phase transition and phase stability in [110]-, [001]-, and [111]-oriented 0.68 Pb(Mg1/3Nb2/3)O3-0.32 PbTiO3 single crystal under electric field", Journal of Applied Physics, vol. 104, 2008, 9 pages.
Fu et al., "Polarization rotation mechanism for ultrahigh electromechanical response in single-crystal piezoelectrics", Nature, vol. 403, Jan. 20, 2000, pp. 281-283.
Sun et al., "Relaxor-based ferroelectric single crystals: Growth, domain engineering, characterization and applications", Progress in Materials Science, vol. 65, 2014, pp. 124-210.
Park et al., "Ultrahigh strain and piezoelectric behavior in relaxor based ferroelectric single crystals", Journal of Applied Physics, vol. 82, No. 4, Aug. 15, 1997, pp. 1804-1811.
International Search Report and Written Opinion received for PCT Application Serial No. PCT/US2020/045073 dated Oct. 28, 2020, 10 pages.
International Preliminary Report on Patentability for International Application No. PCT/US2020/045073, dated Mar. 3, 2022, 8 pages.

* cited by examiner

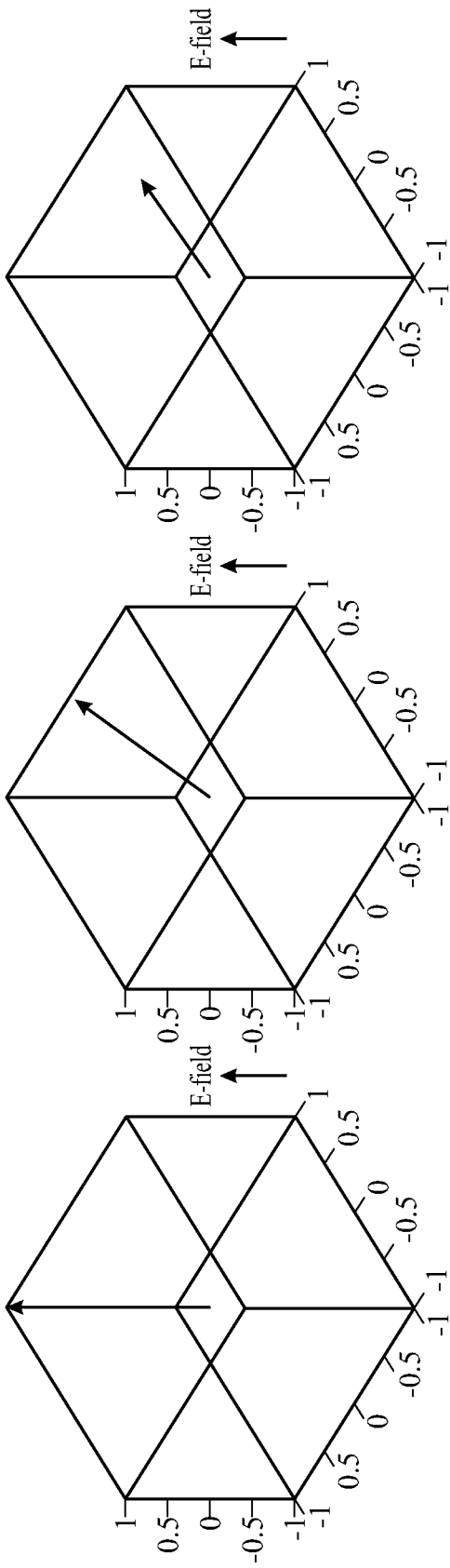

TRANSPARENT PHASE CHANGE ACTUATOR

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 7 is a schematic diagram of an example rhombohedral electroactive ceramic poled along a representative [111] direction according to certain embodiments.

FIG. 8 is a schematic diagram of an example orthorhombic electroactive ceramic poled along a representative [110] direction according to certain embodiments.

FIG. 9 is a schematic diagram of an example tetragonal electroactive ceramic poled along a representative [100] direction according to certain embodiments.

Figure 1:
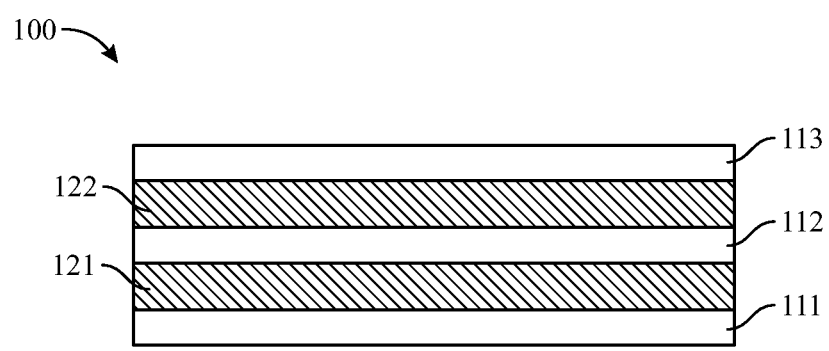
FIG. 1 is a schematic diagram of an example optically transparent multilayer actuator according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Ceramic and other dielectric materials may be incorporated into a variety of optic and electro-optic device architectures, including active and passive optics and electroactive devices. Electroactive materials, including piezoelectric, ferroelectric, and electrostrictive ceramic materials, may change their shape under the influence of an electric field. Electroactive materials have been investigated for use in various technologies, including actuation, sensing and/or energy harvesting. Lightweight and conformable, electroactive ceramics may be incorporated into wearable devices such as haptic devices and are attractive candidates for emerging technologies including virtual reality/augmented reality devices where a comfortable, adjustable form factor is desired.

Virtual reality and augmented reality eyewear devices or headsets may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of electroactive materials, including the piezoelectric effect to generate a lateral deformation (e.g., lateral expansion or contraction) as a response to compression between conductive electrodes. Example virtual reality/augmented reality assemblies containing electroactive layers may include deformable optics, such as mirrors, lenses, or adaptive optics. Deformation of the electroactive ceramic may be used to actuate optical elements in an optical assembly, such as a lens system.

Although thin layers of many electroactive piezoceramics can be intrinsically transparent, in connection with their incorporation into an optical assembly or optical device, a variation in refractive index between such materials and adjacent layers (e.g., air) may cause light scattering and a corresponding degradation of optical quality or performance. In a related vein, ferroelectric materials may spontaneously polarize in different directions forming domains and associated birefringent boundaries that scatter light.

The origin of the piezoelectric response in many ferroelectric materials may be due both to the piezoelectric extension that occurs under the application of an applied electric field and a shear rotation of domains within the material. In some embodiments, when an electric field is applied along a non-polar high-symmetry axis, domains may collectively rotate in the direction of the applied field, resulting (in some cases) in a 10-20× increase in the piezoelectric response as compared to where the material undergoes only a piezoelectric extension.

Further sources of optical scattering include porosity, domain walls, and grain boundaries. Thus, notwithstanding recent developments, it would be advantageous to provide ceramic or other dielectric materials having improved actuation characteristics, including a controllable and robust deformation response in an optically transparent package.

As will be described in greater detail below, the instant disclosure relates to actuatable and transparent optical elements and methods for forming such optical elements. The optical elements may include a layer of electroactive material sandwiched between conductive electrodes. The electroactive layer may have a preferred crystallographic orientation, e.g., with respect to the electrodes, and may be capacitively actuated to deform an adjacent optical element and hence modify its optical performance. By configuring an electroactive ceramic to have a preferred crystallographic orientation, the refractive index gradient between adjacent grains may be decreased, thereby decreasing optical scattering and improving optical quality. In some embodiments, an electroactive ceramic may undergo an applied field-induced rotation and coalescence of domains and an attendant phase transformation resulting in less birefringent scattering and improved optical performance. In certain embodiments, an optical element may be located within the transparent aperture of an optical device such as a liquid lens, although the present disclosure is not particularly limited and may be applied in a broader context. By way of example, the optical element may be incorporated into an active grating, tunable lens, accommodative optical element, or adaptive optics and the like. According to various embodiments, the optical element may be optically transparent.

As used herein, a material or element that is "transparent" or "optically transparent" may, for example, have a transmissivity (i.e., optical transmittance) within the visible light spectrum of at least approximately 50%, e.g., approximately 50, 60, 70, 80, 90, 95, 97, 98, 99, or 99.5%, including ranges between any of the foregoing values, and less than approximately 80% haze, e.g., approximately 1, 2, 5, 10, 20, 30, 40, 50, 60 or 70% haze, including ranges between any of the foregoing values. In accordance with some embodiments, a "fully transparent" material or element may have a transmissivity within the visible light spectrum of at least approximately 75%, e.g., approximately 75, 80, 90, 95, 97, 98, 99, or 99.5%, including ranges between any of the foregoing values, and less than approximately 10% haze, e.g., approximately 0, 1, 2, 4, 6, or 8% haze, including ranges between any of the foregoing values. Transparent and fully transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

Referring to FIG. 1, in accordance with various embodiments, an optical element 100 may include a primary electrode 111, a secondary electrode 112 overlapping at least a portion of the primary electrode, and a first electroactive layer 121 disposed between and abutting the primary electrode 111 and the secondary electrode 112, where the optical element 100 is optically transparent. In the illustrated embodiment, the disclosed multilayer architecture may further include a second electroactive layer 122 disposed over the secondary electrode 112, and a tertiary electrode 113 disposed over the second electroactive layer 122, i.e., opposite to and overlapping at least a portion of the secondary electrode 112.

As used herein, "electroactive materials" may, in some examples, refer to materials that exhibit a change in size or shape when stimulated by an electric field. In the presence of an electrostatic field (E-field), an electroactive material may deform (e.g., compress, elongate, bend, etc.) according to the magnitude and direction of the applied field. Generation of such a field may be accomplished by placing the electroactive material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive material may be in its relaxed state undergoing no induced deformation, or stated equivalently, no induced strain, either internal or external.

In some instances, the physical origin of the compressive nature of electroactive materials in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and elastic compliance of the electroactive material. Compliance in this case is the change of strain with respect to stress or, analogously, in more practical terms, the change in displacement with respect to force. In some embodiments, an electroactive layer may be pre-strained (or pre-stressed) to modify the stiffness of the optical element and hence its actuation characteristics.

In some embodiments, the physical origin of the electromechanical strain of electroactive materials in the presence of an E-field, being the electrically-induced strain in crystalline materials lacking inversion symmetry, derives from the converse piezoelectric effect, which is expressed mathematically with the piezoelectric tensor.

The electroactive layer may include a ceramic material, for example, and the electrodes may each include one or more layers of any suitable conductive material(s), such as transparent conductive oxides (e.g., TCOs such as ITO), graphene, etc. In some embodiments, a polycrystalline ceramic may have a relative density of at least 99%, which can mitigate the impact of scattering on optical quality by decreasing scattering from internal air-material interfaces, as well as a preferred crystallographic orientation, which can mitigate the impact of scattering on optical quality by decreasing the effective magnitude of the birefringence between grains.

Example electroactive ceramics may include one or more electroactive, piezoelectric, antiferroelectric, relaxor, or ferroelectric ceramics, such as perovskite ceramics, including lead titanate, lead zirconate, lead zirconate titanate (PZT), lead magnesium niobate, lead zinc niobate, lead indium niobate, lead magnesium tantalate, lead magnesium niobate-lead titanate (PMT-PT), lead zinc niobate-lead titanate (PZN-PT), lead indium tantalate, barium titanate, lithium niobate, potassium niobate, sodium potassium niobate, bismuth sodium titanate, and bismuth ferrite, as well as solid solutions or mixtures thereof. Example non-perovskite piezoelectric ceramics include quartz and gallium nitride. According to some embodiments, an electroactive ceramic may be doped with one or more dopants selected from calcium, lanthanum, europium, neodymium, scandium, and erbium.

In certain embodiments, the electroactive ceramics disclosed herein may be perovskite ceramics and may be substantially free of secondary phases, i.e., may contain less than approximately 2% by volume of any secondary phase, including porosity, e.g., less than 2%, less than 1%, less than 0.5%, less than 0.2%, or less than 0.1%, including ranges between any of the foregoing values. Further example secondary phases may include pyrochlores, which may adversely impact the material's piezoelectric response. In certain embodiments, the disclosed electroactive ceramics may be birefringent, which may be attributable to the material including plural distinct domains or regions of varying polarization having different refractive indices, such that the refractive index experienced by light passing through the material may be a function of the propagation direction of the light as well as its polarization.

Ceramic electroactive materials, such as single crystal piezoelectric materials, may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes may be formed directly on the wafer, e.g., using chemical vapor deposition or a physical vapor deposition process such as sputtering or evaporation.

In addition to the foregoing, polycrystalline piezoelectric materials may be formed, e.g., by powder processing. Densely-packed networks of high purity, ultrafine polycrystalline particles can be highly transparent and may be more mechanically robust in thin layers than their single crystal counterparts. For instance, optical grade lanthanum-doped lead zirconate titanate (PLZT) having >99.9% purity may be formed using sub-micron (e.g., <2 μm) particles. In this regard, substitution via doping of $Pb^{2+}$ at A and B-site vacancies with $La^{2+}$ and/or $Ba^{2+}$ may be used to increase the transparency of perovskite ceramics such as PZN-PT, PZT and PMN-PT.

According to some embodiments, ultrafine particle precursors can be fabricated via wet chemical methods, such as chemical co-precipitation, sol-gel and gel combustion. Green bodies may be formed using tape casting, slip casting, or gel casting. High pressure and high temperature sintering using techniques such as hot pressing, high pressure (HP) and hot isostatic pressure, spark plasma sintering, and microwave sintering, for example, may be used to improve the ceramic particle packing density. Thinning via lapping, grinding and/or polishing may be used to decrease surface roughness to achieve thin, highly optically transparent layers that are suitable for high displacement actuation. As measured by atomic force microscopy (AFM) or interferometry, an electroactive ceramic may have an RMS surface roughness of less than approximately 5 nm, e.g., approximately 1, 2, or 5 nm, including ranges between any of the foregoing values.

The electroactive ceramic may be poled to achieve a desired dipole alignment. As used herein, "poling" to form a "poled" material may, in some examples, refer to a process whereby an electric field is applied to an electroactive ceramic. The effect of poling may include an alignment of the various domains within the material to produce a net polarization in the direction of the applied field.

Ceramics having a preferred crystallographic orientation (i.e., texture) may be formed by various methods, including electrophoresis, slip casting, electric field alignment, magnetic field alignment, high pressure sintering, uniaxial pressing, temperature gradients, spark plasma sintering, directional solidification, templated grain growth, rolling, and shear alignment.

As will be appreciated, the methods and systems shown and described herein may be used to form electroactive devices having a single layer or multiple layers of an electroactive material (e.g., a few layers to tens, hundreds, or thousands of stacked layers). For example, an electroactive device may include a stack of from two electroactive layers and corresponding electrodes to thousands of electroactive layers (e.g., approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive layers, including ranges between any of the foregoing values). A large number of layers may be used to achieve a high displacement output, where the overall device displacement may be expressed as the sum of the displacement of each layer. Such complex arrangements can enable compression, extension, twisting, and/or bending when operating the electroactive device.

In some embodiments, optical elements may include paired electrodes, which allow the creation of the electrostatic field that forces constriction of the electroactive layer. In some embodiments, an "electrode," as used herein, may refer to an electrically conductive material, which may be in the form of a thin film or a layer. Electrodes may include relatively thin, electrically conductive metals or metal alloys and may be of a non-compliant or compliant nature.

An electrode may include one or more electrically conductive materials, such as a metal, a semiconductor (such as a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc tin oxide, strontium vanadate, strontium niobate, strontium molybdate, calcium molybdate, and indium zinc tin oxide.

In some embodiments, the electrode or electrode layer may be self-healing, such that damage from local shorting of a circuit can be isolated. Suitable self-healing electrodes may include thin films of materials which deform or oxidize irreversibly upon Joule heating, such as, for example, aluminum.

In some embodiments, a primary electrode may overlap (e.g., overlap in a parallel direction) at least a portion of a secondary electrode. The primary and secondary electrodes may be generally parallel and spaced apart and separated by a layer of electroactive material. A tertiary electrode may overlap at least a portion of either the primary or secondary electrode.

An optical element may include a first electroactive layer, which may be disposed between a first pair of electrodes (e.g., the primary electrode and the secondary electrode). A second optical element, if used, may include a second electroactive layer and may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include a metal such as aluminum, graphene, carbon nanotubes, etc. In other embodiments, relatively rigid electrodes (e.g., electrodes including one or more transparent conducting oxides (TCOs) such as indium oxide, tin oxide, indium tin oxide (ITO), indium gallium zinc oxide (IGZO), and the like) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, and the like.

In some embodiments, a layer of electroactive material may be deposited directly on to an electrode. In some embodiments, an electrode layer may be deposited directly on to the electroactive material. In some embodiments, electrodes may be prefabricated and attached to an electroactive material. In some embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

The electrodes may be used to affect large scale deformation, i.e., via full-area coverage, or the electrodes may be patterned to provide spatially localized stress/strain profiles.

In particular embodiments, a deformable optical element and an electroactive layer may be co-integrated whereby the deformable optic may itself be actuatable. In addition, various methods of forming optical elements are disclosed, including solution-based and solid-state deposition techniques.

In accordance with certain embodiments, an optical element including an electroactive layer disposed between transparent electrodes may be incorporated into a variety of device architectures where capacitive actuation and the attendant strain realized in the electroactive layer (i.e., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional. In some embodiments, the engineered deformation of two or more electroactive layers that are alternatively placed in expansion and compression by oppositely applied voltages may be used to induce bending or curvature changes in a device stack, which may be used to provide optical tuning such as focus or aberration control.

In some applications, an optical element used in connection with the principles disclosed herein may include a primary electrode, a secondary electrode, and a textured, optically transparent electroactive layer disposed between the primary electrode and the secondary electrode. According to various embodiments, the electroactive layer may be formed by microstructural engineering.

In some embodiments, there may be one or more additional electrodes, and a common electrode may be electrically coupled to one or more of the additional electrodes. For example, optical elements may be disposed in a stacked configuration, with a first common electrode coupled to a first plurality of electrodes, and a second common electrode coupled to a second plurality of electrodes. The first and second pluralities may alternate in a stacked configuration, so that each optical element is located between one of the first plurality of electrodes and one of the second plurality of electrodes.

In some embodiments, an optical element (i.e., one or more layers of an electroactive ceramic having a preferred crystallographic orientation disposed between and abutting respective electrodes) may have a thickness of approximately 10 nm to approximately 300 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8 µm, approximately 9 µm, approximately 10 µm, approximately 20 µm, approximately 50 µm, approximately 100 µm, approximately 200 µm, or approximately 300 µm), with an example thickness of approximately 200 nm to approximately 500 nm.

The application of a voltage between the electrodes can cause compression or expansion of the intervening electroactive layer(s) in the direction of the applied electric field and an associated expansion or contraction of the electroactive layer(s) in one or more transverse dimensions. In some embodiments, an applied voltage (e.g., to the primary electrode and/or the secondary electrode) may create at least approximately 0.02% strain (e.g., an amount of deformation in the direction of the applied force resulting from the applied voltage divided by the initial dimension of the material) in the electroactive layer(s) in at least one direction (e.g., an x, y, or z direction with respect to a defined coordinate system). In some embodiments, an applied voltage may induce domain restructuring within the electroactive layer(s), where one or more domains may rotate in the direction of the applied field.

In some embodiments, the electroactive response may include a mechanical response to the electrical input that varies over the spatial extent of the device, with the electrical input being applied between the primary electrode and the secondary electrode. The mechanical response may be termed an actuation, and example devices or optical elements may be, or include, actuators. According to certain embodiments, an optically transparent actuator may be incorporated into an assembly that provides tunable optical power.

The optical element may be deformable from an initial state to a deformed state when a first voltage is applied between the primary electrode and the secondary electrode and may further be deformable to a second deformed state when a second voltage is applied between the primary electrode and the secondary electrode.

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive layer between the primary and secondary electrodes. A non-uniform electroactive response may include a curvature of a surface of the optical element, which may in some embodiments be a compound curvature.

In some embodiments, an optical element may have a maximum thickness in an undeformed state and a compressed thickness in a deformed state. In some embodiments, an optical element may have a density in an undeformed state that is approximately 90% or less of a density of the optical element in the deformed state. In some embodiments, an optical element may exhibit a strain of at least approximately 0.02% when a voltage is applied between the primary electrode and the secondary electrode.

As described in further detail herein, the applied electrical signal may induce a rotation of domains within the electroactive layer and, under a sufficiently high electric field, a restructuring of the crystalline symmetry of the ceramic layer. That is, in accordance with various embodiments, the electroactive layer may undergo an E-field induced phase transformation.

In some embodiments, an optical device may include one or more optical elements, and an optical element may include one or more electroactive layers. In various embodiments, an optical element may include a primary electrode, a secondary electrode overlapping at least a portion of the primary electrode, and an electroactive layer having a preferred crystallographic orientation disposed between the primary electrode and the secondary electrode.

In some embodiments, the application of an electric field over an entirety of an electroactive layer may generate substantially uniform deformation between the primary and secondary electrodes. In some embodiments, the primary electrode and/or the secondary electrode may be patterned, allowing a localized electric field to be applied to a portion of the optical element, for example, to provide a localized deformation.

According to some embodiments, patterned electrodes (e.g., one or both of a primary electrode and a secondary electrode) may be used to actuate one or more regions within an intervening electroactive layer, i.e., to the exclusion of adjacent regions within the same electroactive layer. For example, spatially-localized actuation of optical elements that include a ceramic electroactive layer can be used to tune the birefringence of such a structure, where the birefringence may be a function of local mechanical stress, including domain restructuring.

In some embodiments, such patterned electrodes may be independently actuatable. Patterned electrodes may be formed by selective deposition of an electrode layer or by blanket deposition of an electrode layer followed by patterning and etching, e.g., using photolithographic techniques, as known to those skilled in the art. For instance, a patterned electrode may include a wire grid, or a wire grid may be incorporated into an optical element as a separate layer adjacent to an electrode layer. Discretely patterned electrodes may be individually addressable with distinct voltages, either simultaneously or sequentially.

An optical device may include a plurality of stacked elements. For example, each element may include an electroactive layer disposed between a pair of electrodes. In some embodiments, an electrode may be shared between elements; for example, a device may have alternating electrodes and an electroactive layer located between neighboring pairs of electrodes. Various stacked configurations can be constructed in different geometries that alter the shape, alignment, and spacing between elements. Such complex arrangements can enable compression, extension, twisting, and/or bending when operating such an actuator.

In some embodiments, an optical device may include additional elements interleaved between electrodes, such as in a stacked configuration. For example, electrodes may form an interdigitated stack of electrodes, with alternate electrodes connected to a first common electrode and the remaining alternate electrodes connected to a second common electrode. An additional optical element may be disposed on the other side of a primary electrode. The additional optical element may overlap a first optical element. An additional electrode may be disposed abutting a surface of any additional optical element.

In some embodiments, an optical device may include more (e.g., two, three, or more) such additional electroactive layers and corresponding electrodes. For example, an optical device may include a stack of two or more optical elements and corresponding electrodes. For example, an optical device may include between 2 optical elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 optical elements.

The present disclosure is generally directed to crystallographically textured electroactive ceramics and optical elements that include crystallographically textured electroactive ceramics. As will be explained in greater detail below, example electroactive ceramics may be characterized by a preferred crystallographic orientation where the preferred crystallographic orientation may be aligned substantially parallel to a polar axis of the electroactive ceramic and, in certain embodiments parallel to each of the primary electrode and the secondary electrode of an optical element. As used herein, "substantially parallel" orientations may be misaligned by up to 5°, e.g., 0, 1, 2, 3, 4, or 5°, including ranges between any of the foregoing values. Such a textured electroactive ceramic may include a distribution of orientations having a full width half maximum (FWHM) of less than approximately 20°, e.g., 1, 2, 5, 10 or 20°, including ranges between any of the foregoing values.

In some embodiments, a textured electroactive ceramic may be characterized by a Lotgering factor of at least 90%. The Lotgering factor may provide an estimate of the degree of orientation in a textured material. The Lotgering factor (F), which varies from 0 for a random, non-oriented material to 1 for a completely oriented material, may be calculated as $F=(P-P_0)/(1-P_0)$, with $P=\Sigma I_{(001)}/\Sigma I_{(hkl)}$, where P is the sum of the integrated intensities for all the diffractions in the direction of the preferential crystallographic orientation divided by the sum of the intensities of all (hkl) diffractions, and $P_0$ is similarly defined for a randomly-oriented sample. In particular embodiments, the optical properties of the disclosed electroactive ceramics, including transmissivity, haze, and clarity, may be stable (i.e., substantially invariant) in response to an applied voltage. In further embodiments, the transmissivity and clarity may increase while the bulk haze may decrease in response to an applied voltage.

In some embodiments, electroactive ceramics disclosed herein may exhibit greater than approximately 10% bulk haze in the absence of an applied field and less than approximately 10% bulk haze, e.g., 1, 2, 5, or 8%, including ranges between any of the foregoing values, during the application of an applied field. In some embodiments, electroactive ceramics disclosed herein may exhibit greater than approximately 10% bulk haze in the absence of an applied field and during the application of an applied field a decrease in the bulk haze of at least approximately 25%, e.g., 25%, 50%, 100%, 150%, or a 200% decrease in bulk haze, including ranges between any of the foregoing values.

In various embodiments, the applied voltage may range from approximately 0 to 5 MV/m, e.g., 0, 0.5, 1, 1.5, 2, 2.5, 3, 3.5, 4, 4.5, or 5 MV/m, including ranges between any of the foregoing values, or from 0 to -5 MV/m, e.g., 0, -0.5, -1, -1.5, -2, -2.5, -3, -3.5, -4, -4.5, or -5 MV/m, including ranges between any of the foregoing values. In certain embodiments, the electroactive ceramics may exhibit a single domain state, which may beneficially impact optical transparency. In various embodiments, the applied voltage may create an electric field equal to at least approximately 50% of the breakdown strength of the electroactive ceramic, e.g., 50%, 60%, 70%, 80%, or 90% of the breakdown strength, including ranges between any of the foregoing values. In various embodiments, the applied voltage may create an electric field equal to at least approximately 50% of the coercive field of the electroactive ceramic, e.g., 50%, 75%, 100%, 125%, 150%, 175%, or 200% of the coercive field, including ranges between any of the foregoing values.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-28, detailed descriptions of methods, systems and apparatus for forming actively tunable optical elements that include a crystallographically-textured layer of a transparent and voltage-stable electroactive ceramic. The discussion associated with FIG. 1 includes a description of an optical element including such an electroactive ceramic according to some embodiments. The discussion associated with FIG. 2 includes a description of an equilibrium phase diagram for an example perovskite ceramic. The discussion associated with FIG. 3 includes a description of a polycrystalline electroactive ceramic material having a preferred crystallographic orientation.

Figure 6:
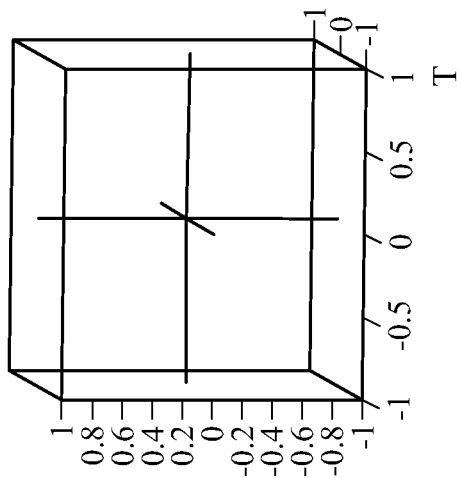
FIG. 6 shows the polar directions for an electroactive ceramic having a tetragonal microstructure according to some embodiments.
Figure 5:
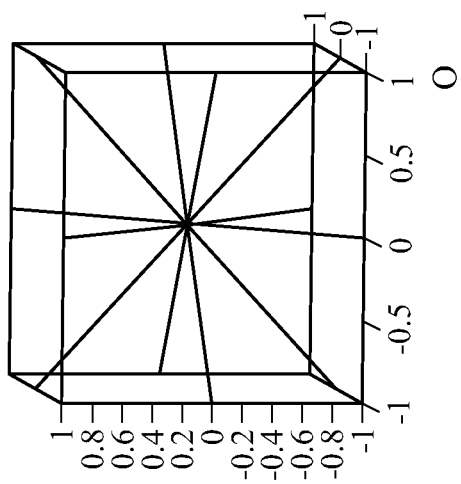
FIG. 5 shows the polar directions for an electroactive ceramic having an orthorhombic or monoclinic microstructure according to some embodiments.
Figure 4:
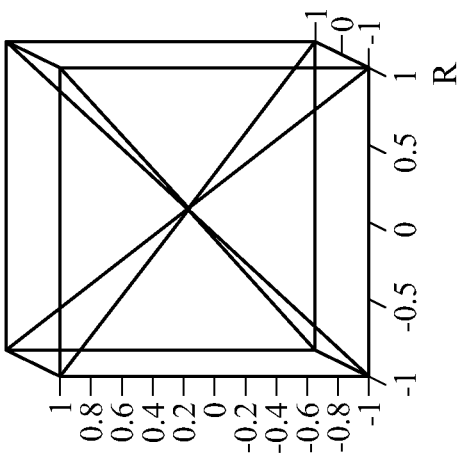
FIG. 4 shows the polar directions for an electroactive ceramic having a rhombohedral microstructure according to some embodiments.

The discussion associated with FIGS. 4-6 includes a description of the poling directions for example perovskite ceramic polymorphs. The discussion associated with FIGS. 7-9 includes a description of various electroactive ceramics poled along a common crystallographic axis. The discussion associated with FIG. 10 includes a description of an E-field induced domain rotation and phase transformation. The discussion associated with FIGS. 11-13 includes a description of the stress field response to an applied electric field for an example electroactive ceramic. The discussion associated with FIGS. 14-25 includes a description of the physical and optical responses to an applied field. The discussion associated with FIGS. 26-28 relates to exemplary virtual reality and augmented reality device architectures that may include an optical element including an actuatable transparent textured electroactive ceramic layer.

In accordance with various embodiments, example electroactive ceramics may include one or more compositions from the relaxor-PT-based family of piezoceramics, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), and ternary crystals such as $Pb(Zn_{1/3}Nb_{2/3})O_3$—$PbTiO_3$—$BaTiO_3$ (PZN-PT-BT). Generally, lead-based relaxor materials may be represented by the formula $Pb(B_1B_2)O_3$, where $B_1$ may include $Mg^{2+}$, $Zn^{2+}$, $Ni^{2+}$, $Sc^{3+}$, $Fe^{3+}$, $Yb^{3+}$, $In^{3+}$, etc. and $B_2$ may include $Nb^{5+}$, $Ta^{5+}$, $W^{6+}$, etc.

Figure 2:
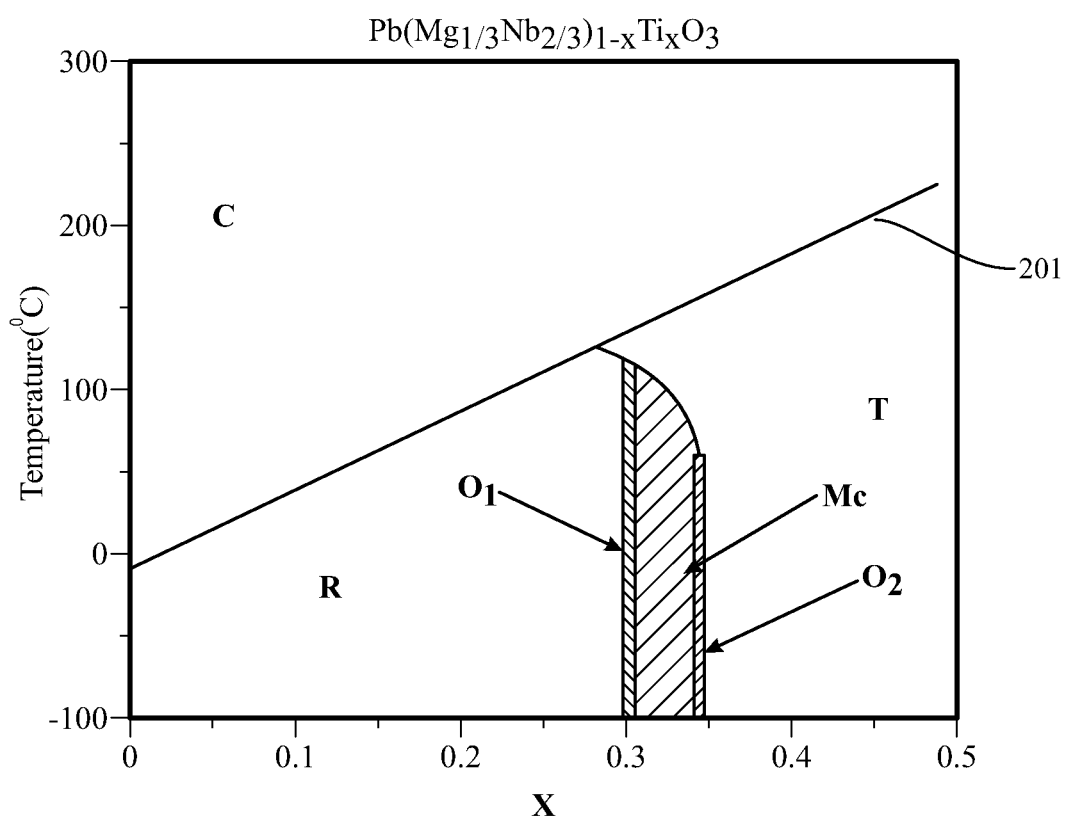
FIG. 2 is an equilibrium phase diagram of an example electroactive ceramic.

The equilibrium phase diagram for $Pb(Mg_{1/3}Nb_{2/3})O_3$—$PbTiO_3$ (PMN-PT) is shown in FIG. 2. As will be appreciated, PMN-PT and other relaxor-PT-based piezoceramics may be polymorphic. With increasing PT content (X), at room temperature (23° C.), PMN-PT exhibits rhombohedral (R), orthorhombic (O1), monoclinic (Mc), orthorhombic (O2) and tetragonal (T) phases. At temperatures above phase boundary 201, PMN-PT also exhibits a high temperature cubic (C) phase.

Figure 3:
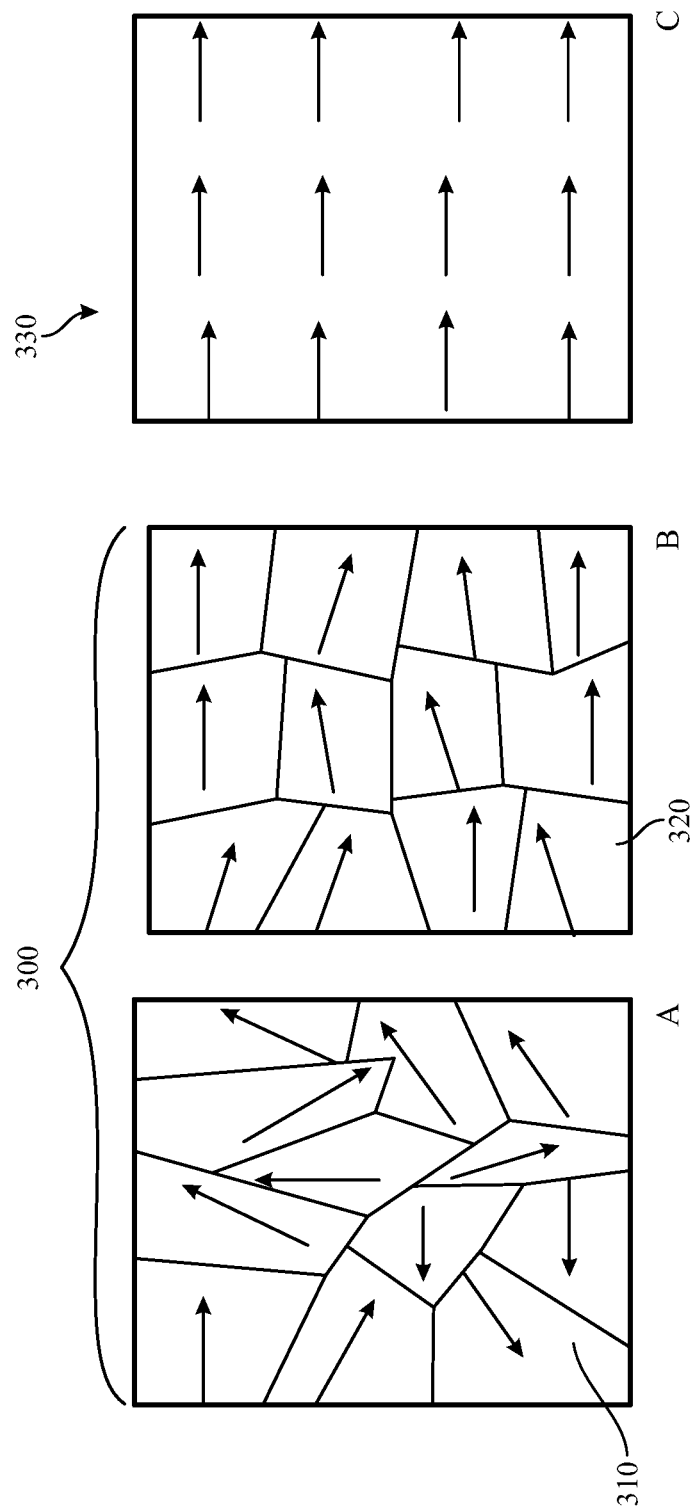
FIG. 3 is a schematic illustration of an electroactive ceramic having (A) randomly-oriented grains, (B) a textured polycrystalline microstructure, and (C) a single crystal microstructure according to various embodiments.

In accordance with some embodiments, the various ceramic phases may be polycrystalline or single crystal. Referring to FIG. 3, polycrystalline structures 300 may include disparately (randomly) oriented grains 310, as shown in FIG. 3A, or grains 320 having a non-random, preferred crystallographic orientation, as shown in FIG. 3B. In certain embodiments, the preferential alignment of grains within a polycrystalline electroactive ceramic may originate during synthesis, e.g., by applying an anisotropic force, such as hot isostatic pressing during compaction and sintering of suitable precursor powder(s). An example single crystal structure 330, which may be regarded as a subcategory of materials having a preferred crystallographic orientation, is shown in FIG. 3C.

Prior to poling (dipole alignment) the individual grains of a polycrystalline piezoceramic may include domains in which the polar direction of the unit cells is aligned randomly among discrete orientations as dictated by the symmetry of the material. Where the grains and domains are randomly oriented, the net polarization of the macroscopic material is zero, i.e., the ceramic does not exhibit piezoelectric properties. The application of a sufficiently high DC field during poling may be used to orient the domains in the field direction and produce a net remanent polarization.

As will be appreciated by those skilled in the art, the polar directions for rhombohedral, orthorhombic, and tetragonal piezoceramic crystals are shown schematically in FIGS. 4-6, respectively. At room temperature (23° C.) rhombohedral structures have a polar direction along <111>, orthorhombic (and monoclinic) structures have a polar direction along approximately <110>, and tetragonal structures have a polar direction along <100>. Thus, rhombohedral materials have 8 polar directions (i.e., from the center towards the corners of a cubic unit cell), orthorhombic materials have 12 polar directions (i.e., from the center towards the edges of a cubic unit cell), and tetragonal materials have 6 polar directions (i.e., from the center towards the faces of a cubic unit cell).

In example single crystal actuators, the electrodes may be oriented perpendicular to non-polar directions, which may preferentially influence electroactive properties at the expense of optical properties. That is, the orientation of electrodes perpendicular to non-polar directions may create a multidomain material and associated electric field-induced scattering of light propagating parallel to the applied electric field, which may increase haze and decrease transmissivity.

According to various embodiments, single domain electroactive piezoceramics may be formed by poling the ceramic along a polar direction. Moreover, improved optical properties of an optical element including such piezoceramics may be attained by aligning each of the primary electrode and the secondary electrode forming an optical element perpendicular to a non-polar direction. By way of example, rhombohedral electroactive crystals may be poled along <111> as illustrated schematically in FIG. 7, orthorhombic (and monoclinic) electroactive crystals may be poled along <110> as shown schematically in FIG. 8, and tetragonal electroactive crystals may be poled along <100>, as shown schematically in FIG. 9. In turn, the primary and secondary electrodes formed over a rhombohedral piezoceramic may be oriented perpendicular to a <110> direction or a <100> direction. The primary and secondary electrodes formed over an orthorhombic piezoceramic may be oriented perpendicular to a <111> direction or a <100> direction. The primary and secondary electrodes formed over a tetragonal piezoceramic may be oriented perpendicular to a <111> direction or a <110> direction. Compared to polycrystalline ceramics having a random distribution of grains, electroactive ceramics having a preferred crystallographic orientation may exhibit substantially less birefringence when light travels parallel to an applied electric field. In some embodiments, the electroactive ceramics disclosed herein may exhibit a polycrystalline microstructure in the absence of an applied field.

Birefringence may undesirably manifest as optical scattering and/or reflective losses in materials. According to various embodiments, the development of textured polycrystalline electroactive ceramics, when oriented and poled along a polar axis, can dramatically decrease birefringence relative to a randomly-oriented ceramic. By way of example, decreasing the angular orientation from 90° (corresponding to an untextured, completely disordered material) to 0.5° may decrease the birefringence by a factor of approximately 100 for a Gaussian distribution of grain orientations, and by a factor of approximately 30 for a Lorentzian distribution of grain orientations.

Disclosed herein are electroactive ceramics and methods for forming electroactive ceramics that may exhibit single domain-like optical properties without exhibiting the relative small piezoelectric coefficients ($d_{33}$, $d_{31}$, $d_{32}$) that are typical of single domain ferroelectrics. Example ceramics may be initially poled along a non-polar orientation to induce a phase transformation whereby domains may reorient along a polar orientation of the material. A rhombohedral PMN-PT composition, for instance, may be initially poled along <110> or <100>; an orthorhombic PMN-PT composition may be initially poled along <111> or <100>; and a tetragonal PMN-PT composition may be initially poled along <111> or <110>.

According to various embodiments, an E-field induced phase transformation may include one or more of (a) a rhombohedral to orthorhombic phase transformation, (b) a rhombohedral to tetragonal phase transformation, (c) an orthorhombic to rhombohedral phase transformation, (d) an orthorhombic to tetragonal phase transformation, (e) a tetragonal to rhombohedral phase transformation, and (f) a tetragonal to orthorhombic phase transformation.

Figure 10:
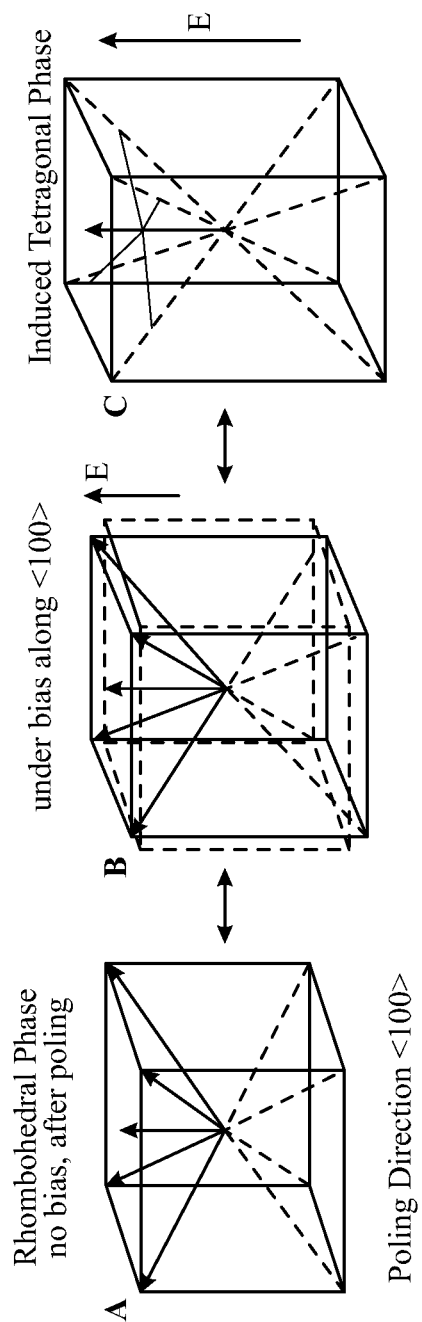
FIG. 10 is a schematic diagram illustrating an E-field induced phase transformation for an example electroactive ceramic according to some embodiments.

An E-field induced phase transformation is shown schematically in FIG. 10. Referring to FIG. 10A and FIG. 10B, a rhombohedral material is initially poled along a <100> orientation. Under the application of a first electrical field (E) in a <100> direction, domains may rotate towards <100>. With the application of a second, larger electric field, the domains may rotate further and the rhombohedral material may undergo a phase transformation to a single domain tetragonal phase as shown in FIG. 10C. As will be appreciated, the tetragonal phase may exhibit less birefringent scattering than the rhombohedral phase. According to various embodiments, domain rotation may be toward a <111> crystallographic direction, a <110> crystallographic direction, or a <100> crystallographic direction.

Figure 11:
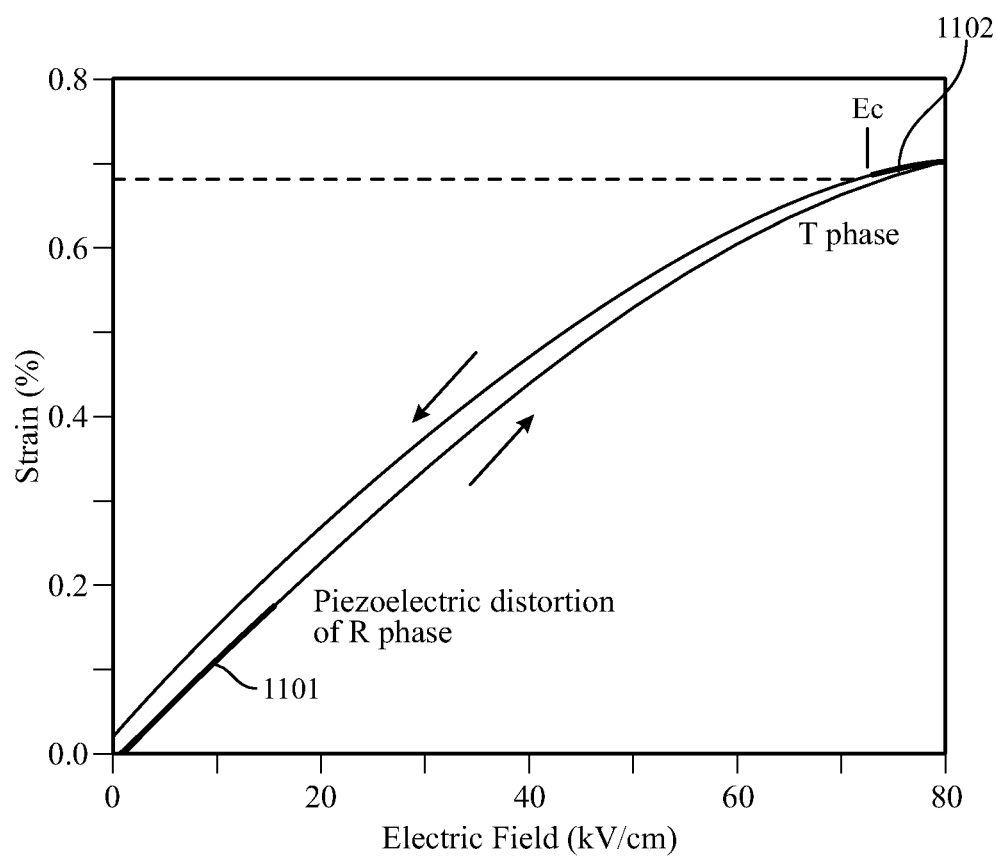
FIG. 11 is a plot of strain versus electric field illustrating the mechanical response of an electroactive ceramic associated with an E-field induced phase transformation according to certain embodiments.

The stress field response for the phase transformation of FIG. 10 is shown graphically in FIG. 11. In the plot of strain versus electric field, at low electric fields (e.g., the first electric field), the PMN-PT material may have a relatively large $d_{33}$ value as evidenced by a first slope 1101 associated with the rhombohedral phase (R). With increasing electric field, the slope of the plot decreases and exhibits a second slope 1102 less than the first slope 1101 corresponding to the formation of the tetragonal phase (T) at a phase transformation field (Ec).

Figure 12:
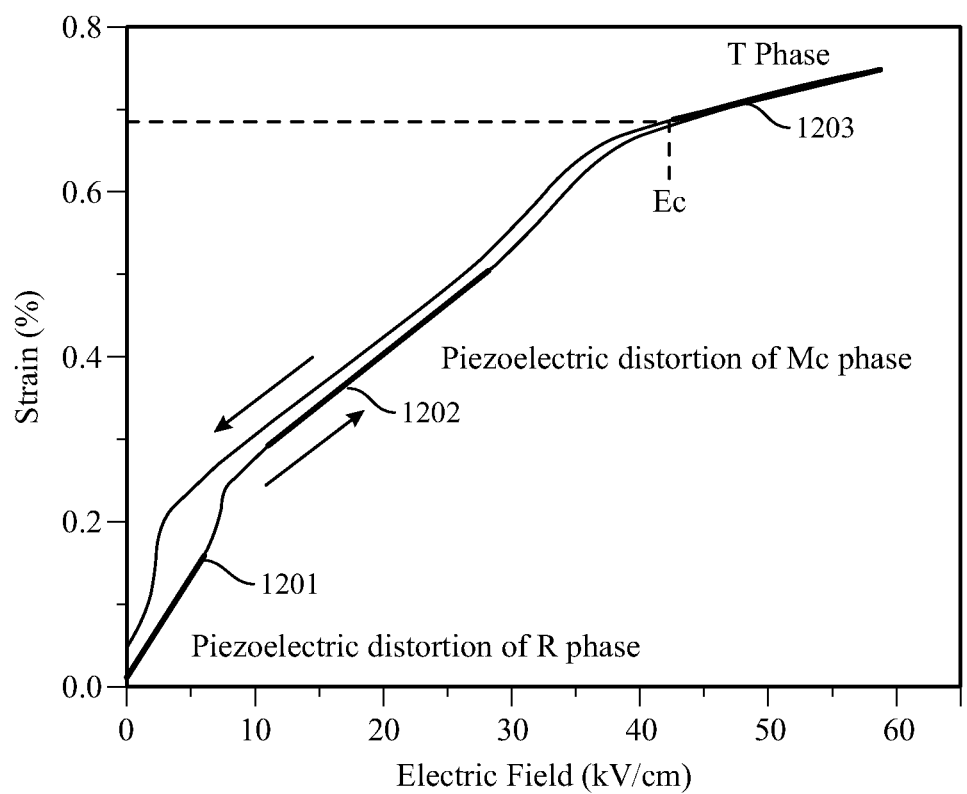
FIG. 12 is a plot of strain versus electric field illustrating the mechanical response of an electroactive ceramic associated with a pair of E-field induced phase transformations according to some embodiments.
Figure 13:
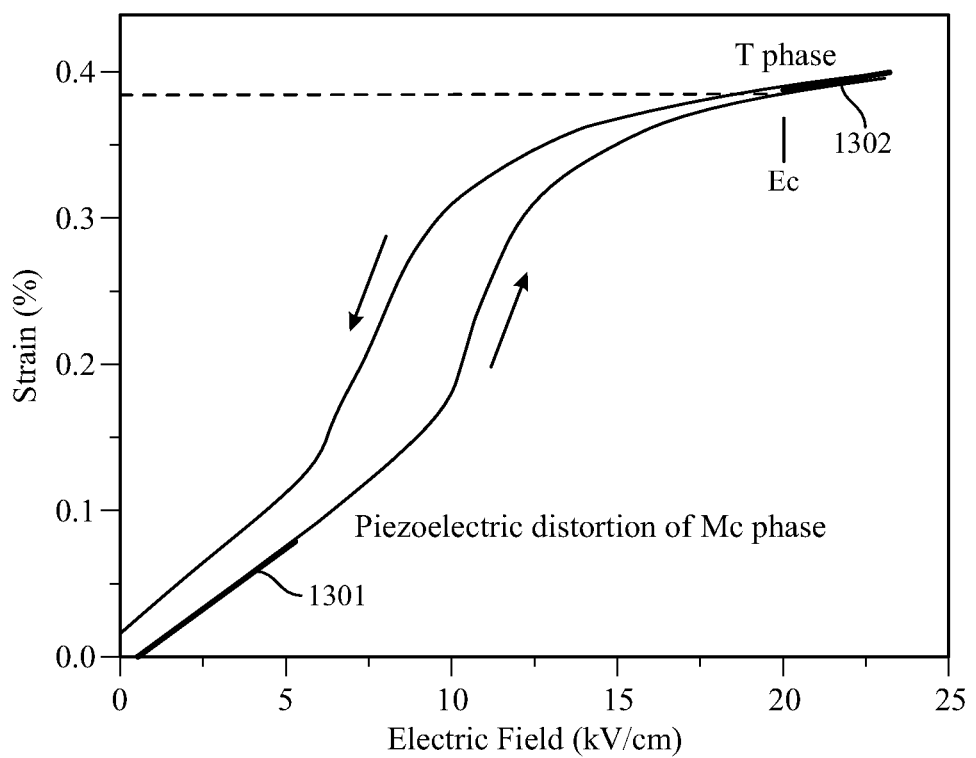
FIG. 13 is a plot of strain versus electric field illustrating the mechanical response of an electroactive ceramic associated with an E-field induced phase transformation according to further embodiments.

Stress field responses for further E-field induced phase transformations are depicted in FIGS. 12 and 13. Referring to FIG. 12, a PMN-PT material having a greater PT content than the material of FIG. 11 may undergo two phase transitions. The material may exhibit a low-field rhombohedral state characterized by a plotted region having a first slope 1201, a transition to an intermediate monoclinic (or orthorhombic) phase characterized by a plotted region having a second slope 1202 less than the first slope 1201, and a second transition to a high field tetragonal phase characterized by a plotted region having a third slope 1203 less than the second slope 1202.

Referring to FIG. 13, a PMN-PT material may have a greater PT content than the material of FIG. 12, e.g., a PMN-PT material initially containing monoclinic (or orthorhombic) phases. Such a material may undergo a monoclinic (or orthorhombic) to tetragonal phase transformation, i.e., from a monoclinic (or orthorhombic) phase characterized by a plotted region having a first slope 1301 to a tetragonal phase characterized by a plotted region having a second slope 1302 less than the first slope 1301.

Optically, the E-field induced conversion from a multidomain rhombohedral or monoclinic phase to a single domain tetragonal phase may substantially decrease bulk birefringent scattering and improve transmissivity and clarity of the electroactive layer. That is, as the domains reorient toward the direction of the applied electric field, the inter-domain misorientation decreases, which may decrease the magnitude of the refractive index difference between adjacent domains. Moreover, as will be appreciated with reference to FIGS. 11-13, the phase transformation field ($E_c$) associated with the transformation to the tetragonal phase may decrease with increasing PT content for PMN-PT.

According to some embodiments, the decrease in birefringence associated with an E-field induced phase change may have a beneficial impact on the optical performance of transparent actuators. The effect of an E-field on selected optical properties for 50 micrometer thick, preferentially oriented (single crystal) transparent electroactive ceramics with n=2.6, a birefringence of 0.025, and an average domain size of 500 nm is shown in FIGS. 14-25 for various phase transformations for both red (700 nm) incident light and blue (400 nm) incident light.

Figure 14:
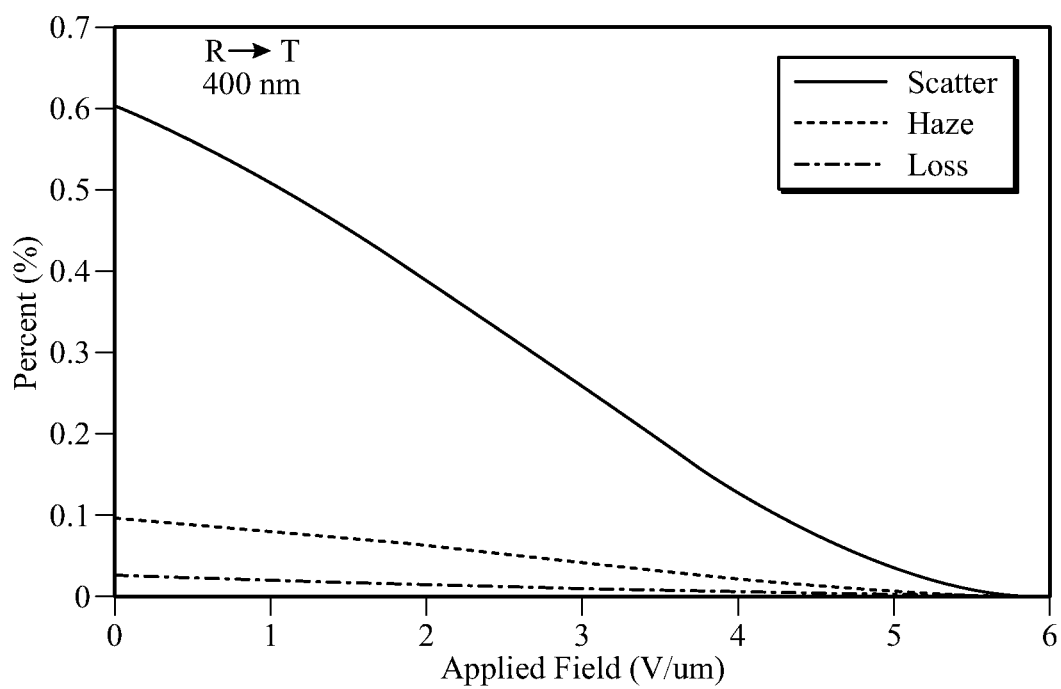
FIG. 14 is a plot showing the impact of an applied field on the optical properties of an electroactive ceramic illuminated with blue light while undergoing a rhombohedral to tetragonal phase transformation according to some embodiments.
Figure 15:
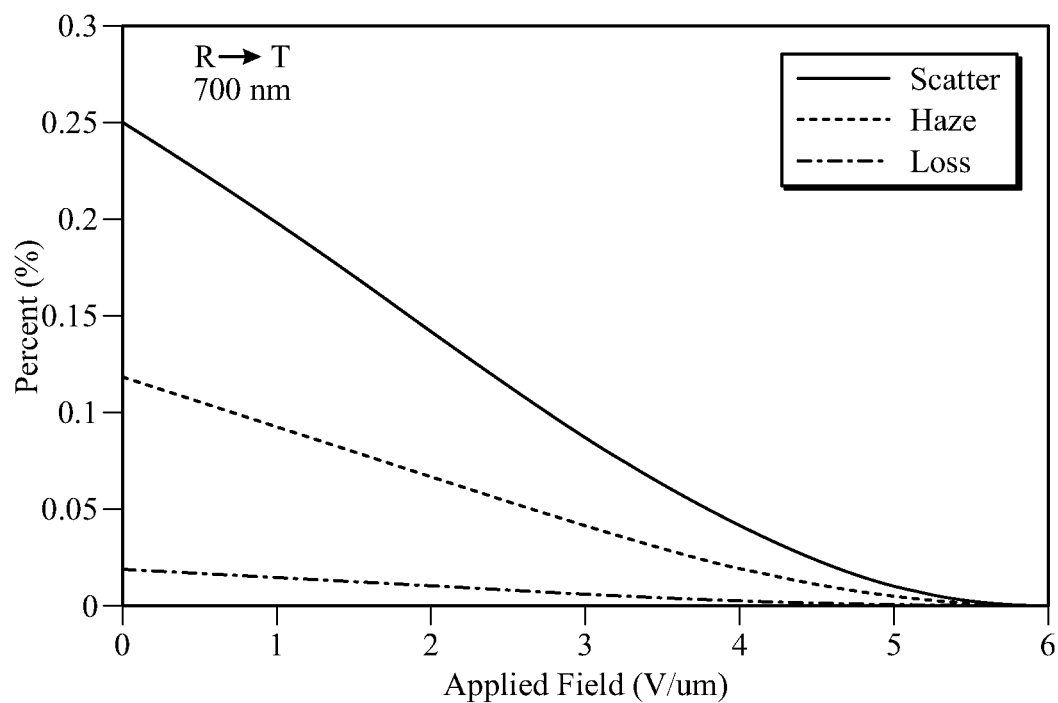
FIG. 15 is a plot showing the impact of an applied field on the optical properties of an electroactive ceramic illuminated with red light while undergoing a rhombohedral to tetragonal phase transformation according to some embodiments.

By way of example, FIGS. 14 and 15 show the simulated bulk scattered light, bulk haze, and bulk reflectivity (loss) for a <100> oriented single crystal PMN-PT material as a function of applied field and the attendant E-field induced phase transformation from the rhombohedral (R) phase to the tetragonal (T) phase. The data in FIG. 14 and FIG. 15 correspond to the domain rotation illustrated schematically in FIG. 10, and illustrate a significant decrease in birefringent scattering for an applied field of approximately 6 V/micron for both incident blue light (FIG. 14) and incident red light (FIG. 15).

Figure 16:
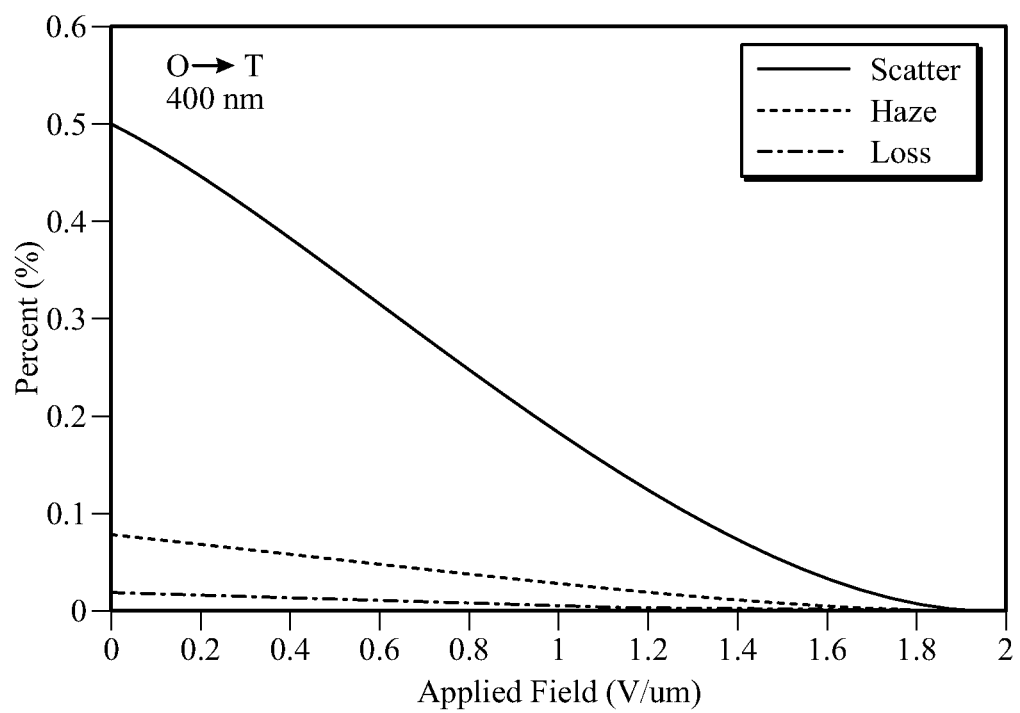
FIG. 16 is a plot showing the impact of an applied field on the optical properties of an electroactive ceramic illuminated with blue light while undergoing an orthorhombic to tetragonal phase transformation according to some embodiments.
Figure 17:
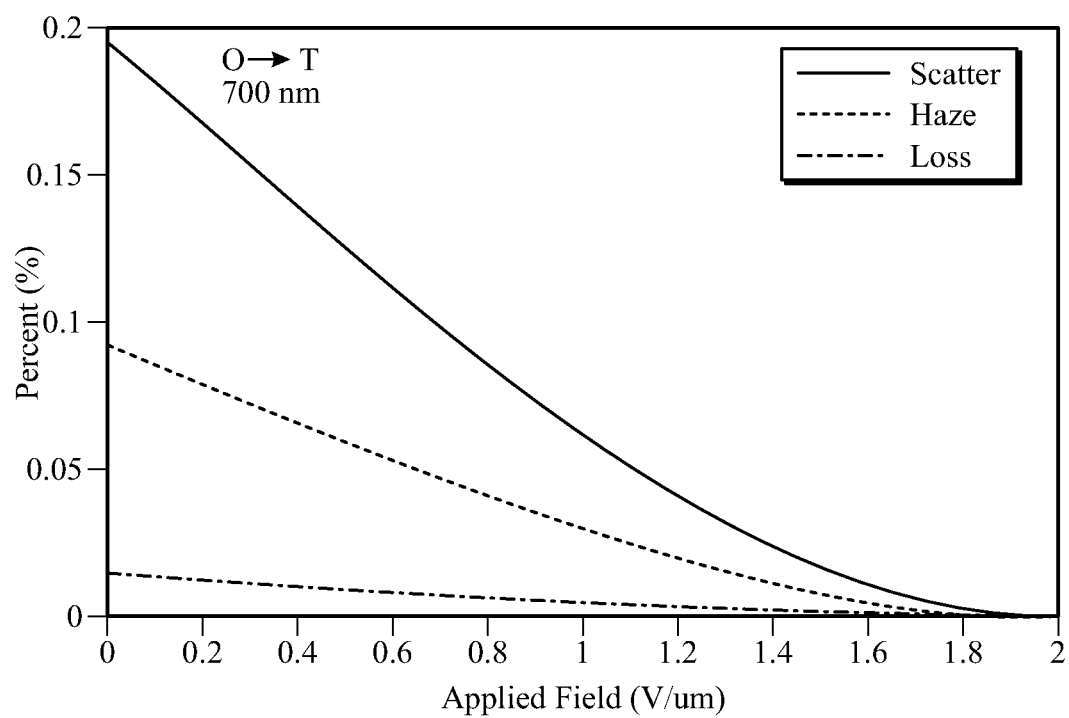
FIG. 17 is a plot showing the impact of an applied field on the optical properties of an electroactive ceramic illuminated with red light while undergoing an orthorhombic to tetragonal phase transformation according to some embodiments.

Referring to FIGS. 16 and 17, shown are simulated data for bulk scattered light, bulk haze, and bulk reflectivity (loss) for a <100> oriented single crystal PMN-PT material as a function of applied field associated with the E-field induced phase transformation from an orthorhombic (O) phase to the tetragonal (T) phase. The data in FIG. 16 and FIG. 17 show a significant decrease in birefringent scattering for an applied field of approximately 2 V/micron for both incident blue light (FIG. 16) and incident red light (FIG. 17). Data from FIGS. 14-17 for applied fields of 0 V/micron and 2 V/micron are summarized in Table 1.

TABLE 1

Optical Properties of Rhombohedral and Orthorhombic PMN-PT

|  |  | Rhombohedral (to Tetragonal Phase Change) | | Orthorhombic (to Tetragonal Phase Change) | |
| --- | --- | --- | --- | --- | --- |
|  |  | 0 V/micron | 2 V/micron | 0 V/micron | 2 V/micron |
| 400 nm | Scatter | 60 | 39 | 50 | 0 |
|  | Haze | 9.4 | 5.9 | 7.3 | 0 |
|  | Loss | 2.4 | 1.2 | 1.8 | 0 |
| 700 nm | Scatter | 24.9 | 14.1 | 19.6 | 0 |
|  | Haze | 11.8 | 6.7 | 9.3 | 0 |
|  | Loss | 1.8 | 0.9 | 1.5 | 0 |

With reference to Table 1, the phase transformation field ($E_c$) associated with the transformation from an orthorhombic phase to the tetragonal phase may be less than the phase transformation field associated with the transformation from the rhombohedral phase to the tetragonal phase. Moreover, the bulk scattered light, bulk haze, and bulk reflective loss for the orthorhombic phase in the unbiased (0 V/micron) condition may be less than respective values for the rhombohedral phase, which may be attributed to the lesser angle of 45 degrees between adjacent orthorhombic domains as compared with 54.7 degrees for adjacent rhombohedral domains.

Figure 18:
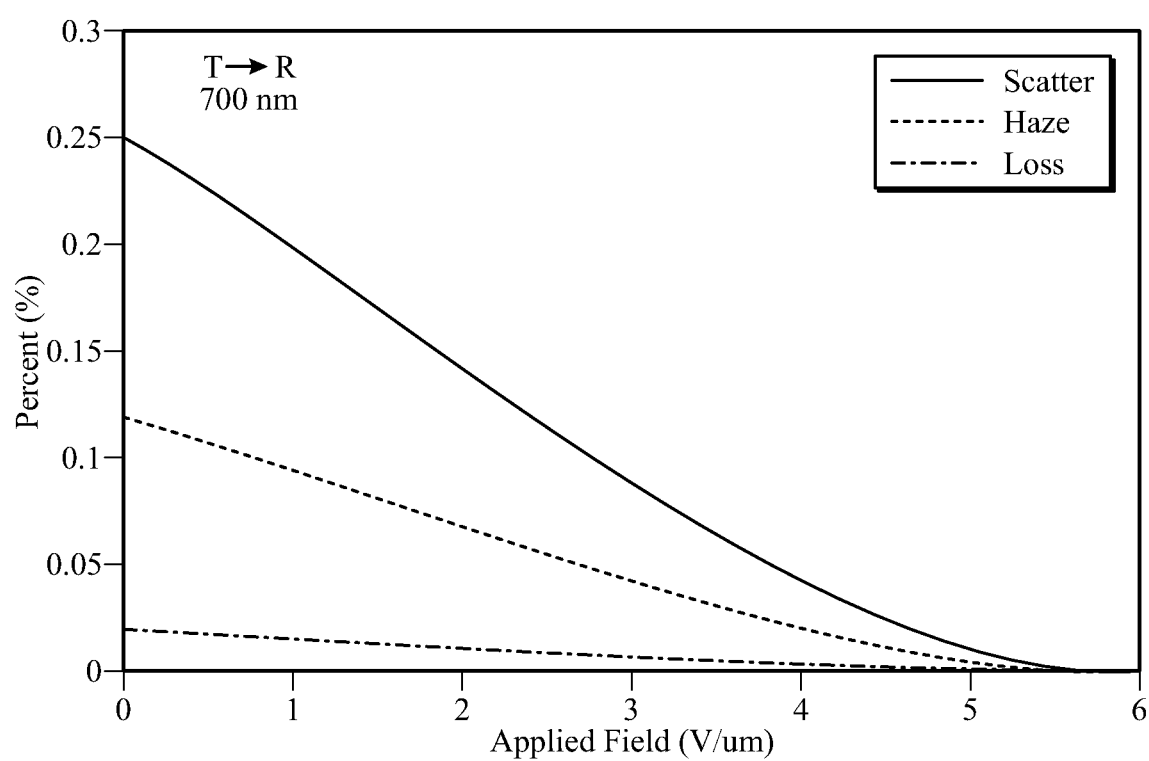
FIG. 18 is a plot showing the impact of an applied field on the optical properties of an electroactive ceramic illuminated with red light while undergoing a tetragonal to rhombohedral phase transformation according to some embodiments.
Figure 19:
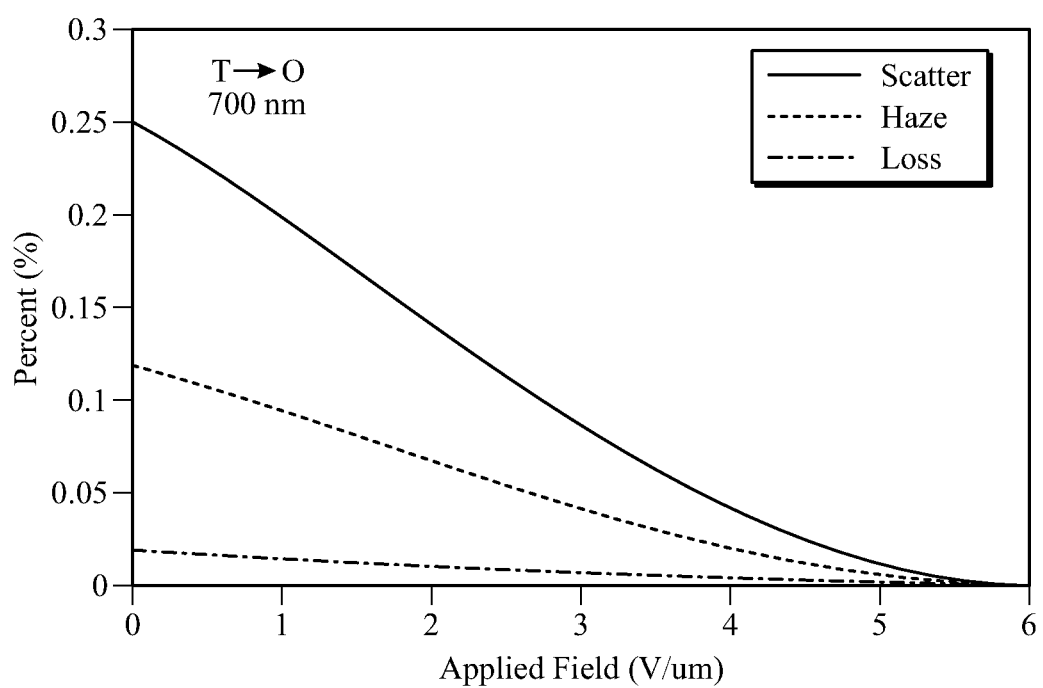
FIG. 19 is a plot showing the impact of an applied field on the optical properties of an electroactive ceramic illuminated with red light while undergoing a tetragonal to orthorhombic phase transformation according to some embodiments.

A simulation of the E-field induced phase transformation of tetragonal <111> oriented PMN-PT to rhombohedral <111> oriented PMN-PT and the associated optical properties for red incident light is shown in FIG. 18, and a simulation of the E-field induced phase transformation of tetragonal <110> oriented PMN-PT to orthorhombic <110> PMN-PT and the associated optical properties for red incident light is shown in FIG. 19.

Figure 20:
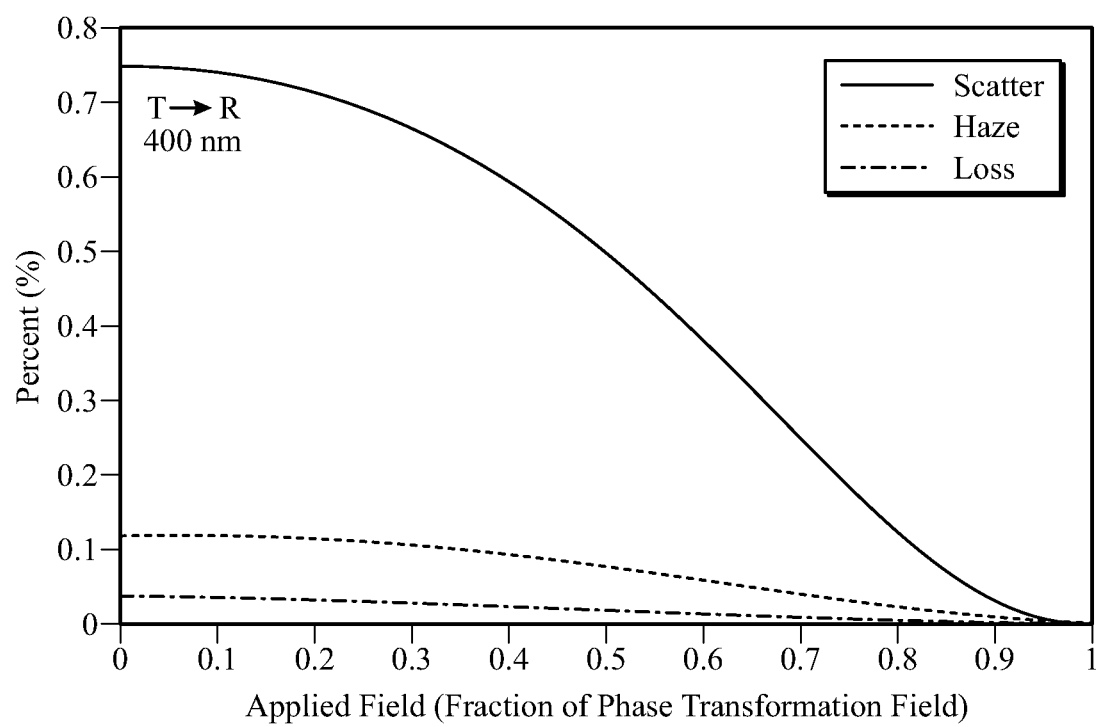
FIG. 20 is a plot showing the impact of an applied field on the optical properties of an electroactive ceramic illuminated with blue light while undergoing a tetragonal to rhombohedral phase transformation according to some embodiments.
Figure 21:
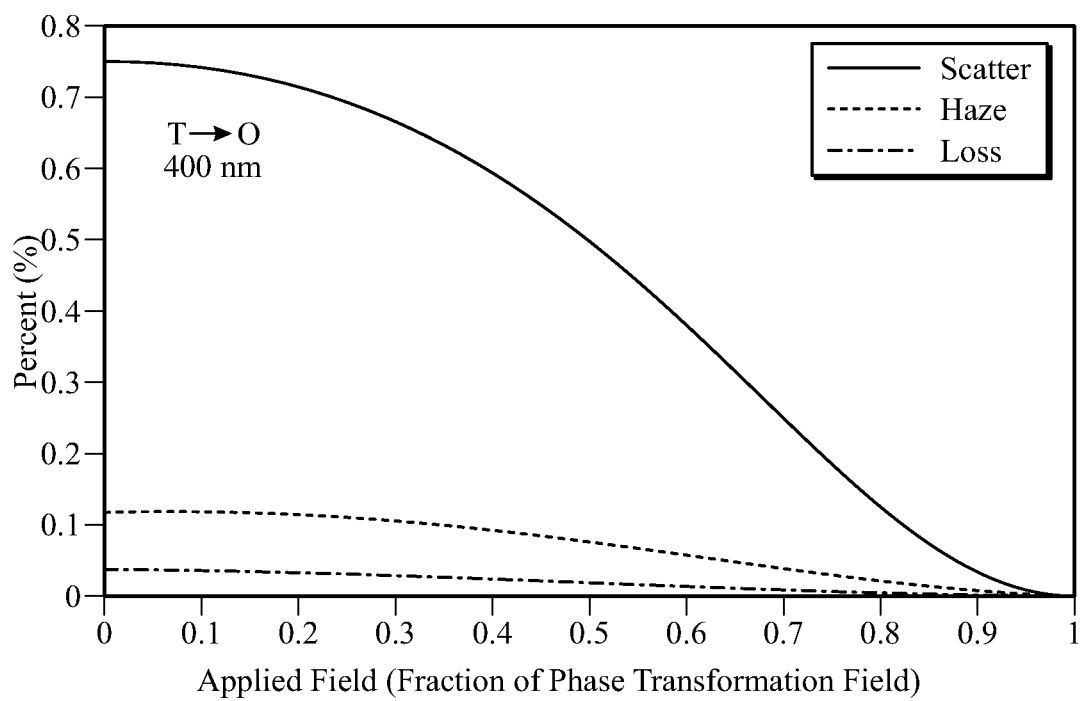
FIG. 21 is a plot showing the impact of an applied field on the optical properties of an electroactive ceramic illuminated with blue light while undergoing a tetragonal to orthorhombic phase transformation according to some embodiments.

Further simulated optical data for various E-field induced phase transformations are shown in FIGS. 20-25, where the data are plotted as a function of the electric field normalized with respect to the associated phase transformation field ($E_c$). Modeled optical data associated with the E-field induced phase transformation of tetragonal <111> oriented PMN-PT to rhombohedral <111> oriented PMN-PT for blue incident light is shown in FIG. 20, and modeled optical data associated with the E-field induced phase transformation of tetragonal <110> oriented PMN-PT to orthorhombic <110> PMN-PT for blue incident light is shown in FIG. 21.

Figure 22:
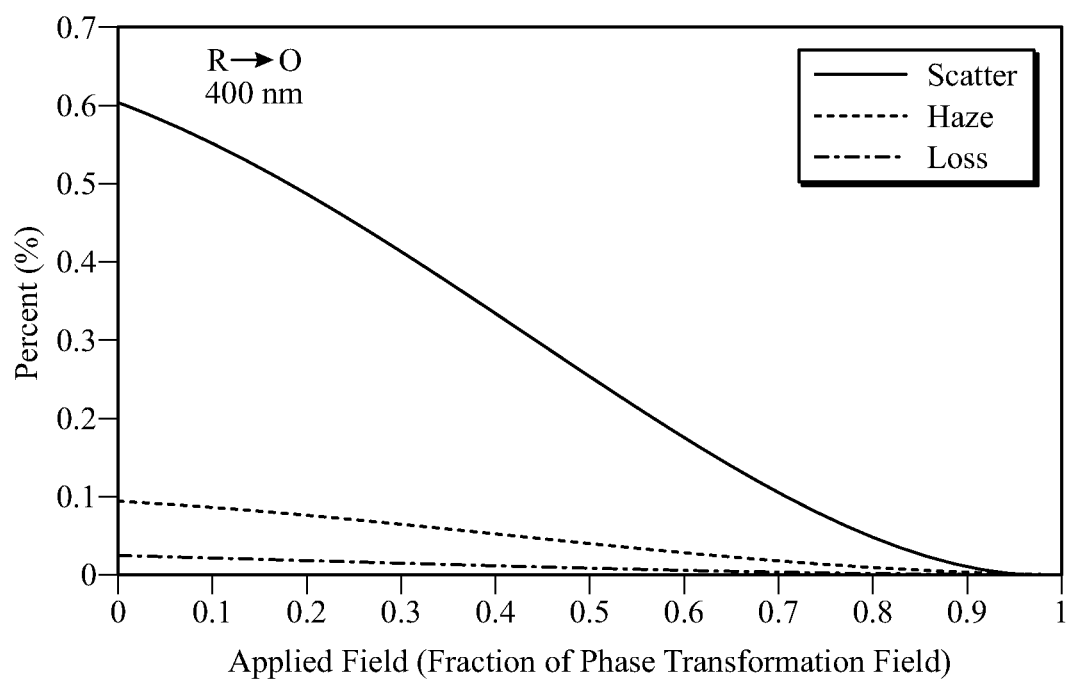
FIG. 22 is a plot showing the impact of an applied field on the optical properties of an electroactive ceramic illuminated with blue light while undergoing a rhombohedral to orthorhombic phase transformation according to some embodiments.
Figure 23:
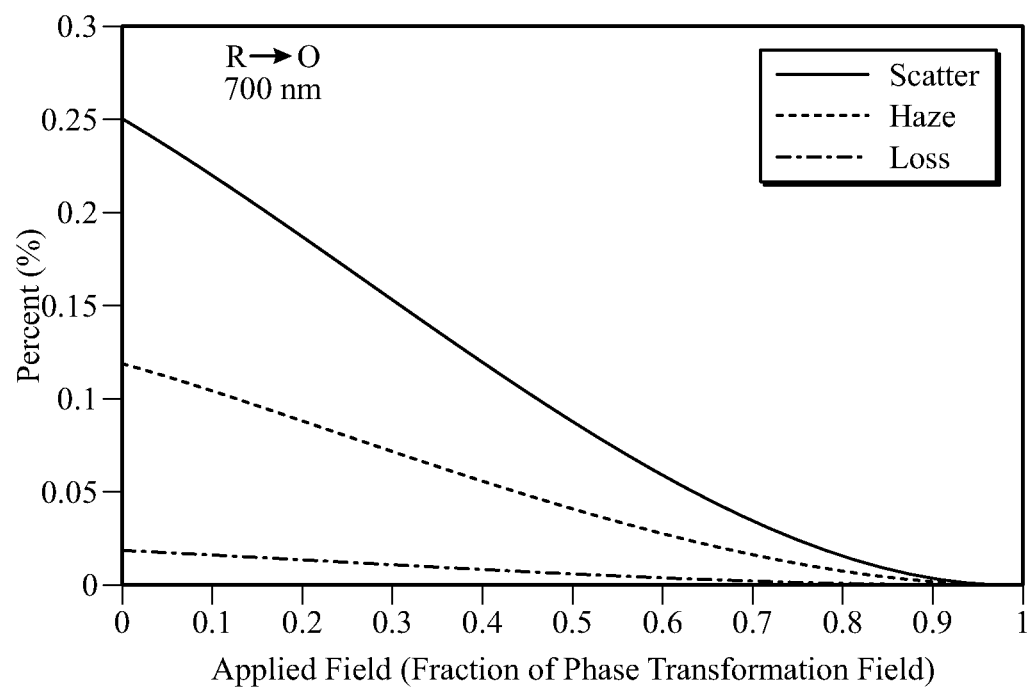
FIG. 23 is a plot showing the impact of an applied field on the optical properties of an electroactive ceramic illuminated with red light while undergoing a rhombohedral to orthorhombic phase transformation according to some embodiments.

Referring to FIG. 22 and FIG. 23, shown are dynamic plots of bulk scattered light, bulk haze, and bulk reflective loss as a function of applied field and the attendant E-field induced phase transformations from a <110> oriented rhombohedral phase to a <110> oriented orthorhombic phase for blue incident light and red incident light, respectively.

Figure 24:
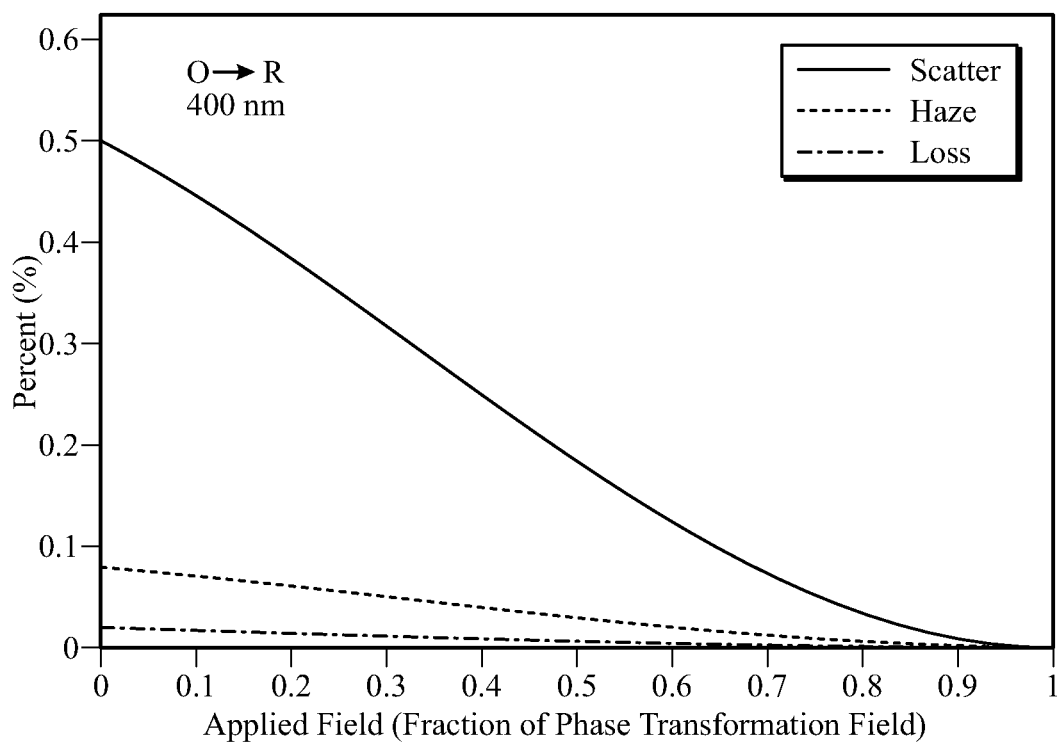
FIG. 24 is a plot showing the impact of an applied field on the optical properties of an electroactive ceramic illuminated with blue light while undergoing an orthorhombic to rhombohedral phase transformation according to some embodiments.
Figure 25:
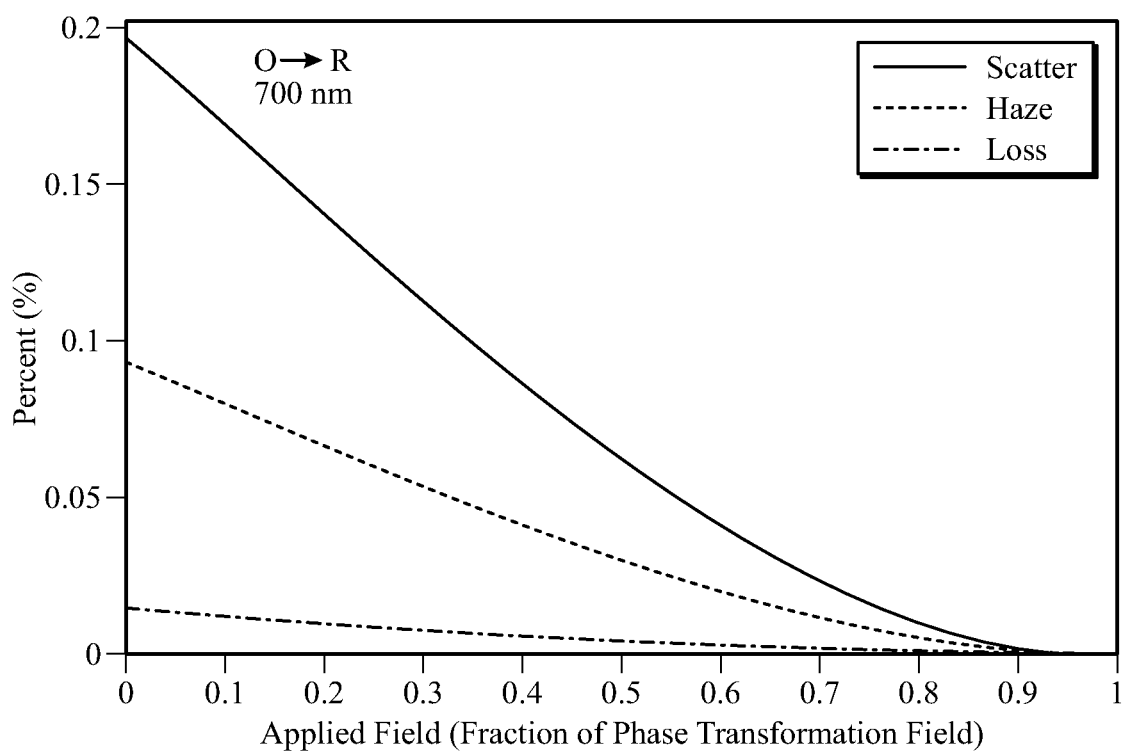
FIG. 25 is a plot showing the impact of an applied field on the optical properties of an electroactive ceramic illuminated with red light while undergoing an orthorhombic to rhombohedral phase transformation according to some embodiments.

Referring to FIG. 24 and FIG. 25, shown are dynamic plots of bulk scattered light, bulk haze, and bulk reflective loss as a function of applied field and the attendant E-field induced phase transformations from a <111> oriented orthorhombic phase to a <111> oriented rhombohedral phase for blue incident light and red incident light, respectively.

In polycrystalline electroactive materials, the presence of multiple locally-oriented grains and the accompanying grain boundaries may contribute to appreciable optical scattering. In this regard, Applicants have shown that textured polycrystalline ceramics, i.e., polycrystalline ceramic materials exhibiting a preferred orientation amongst plural grains, may demonstrate improved optical properties relative to polycrystalline electroactive ceramics having a random orientation of grains. That is, in certain embodiments, a phase transformation induced by an applied voltage and the associated domain restructuring may decrease birefringent scattering.

Example methods of forming dense, optically transparent and textured electroactive ceramics may include forming ceramic powders, mixing, calcination, milling, seeding, green body formation, and high temperature sintering.

High-purity raw materials for the electroactive ceramic composition may include PbO, $Pb_3O_4$, $ZrO_2$, $TiO_2$, MgO, $Mg(OH)_2$ $MgCO_3$, $MnO_2$, $Nb_2O_5$, and $La_2O$, as well as respective hydrates thereof. In some embodiments, the raw materials may be at least approximately 99.9% pure, e.g., 99.9%, 99.95%, or 99.99% pure, including ranges between any of the foregoing values.

Precursor powders of suitable reactant compositions may be prepared by flame spray pyrolysis, for example, whereby an aerosol of an appropriate metal salt, chelate, coordination compound, etc., may be sprayed into a furnace and heated to a temperature sufficient to evaporate the solvent and form nanoscale particles. Precursor powders may also be synthesized by hydrothermal processes, sol-gel processes, or solvothermal processes, as known to those skilled in the art.

Before or after mixing, precursor powders may be milled to produce a desired particle size. Example milling processes include ball milling, e.g., planetary ball milling, and attrition milling, although other milling processes are contemplated. During milling, the particles may be dry or mixed with a liquid such as ethanol. Example precursor powders, i.e., prior to sintering, may have an average particle size of less than approximately 500 nm, e.g., less than approximately 500 nm, less than approximately 400 nm, less than approximately 300 nm, less than approximately 250 nm, less than approximately 200 nm, less than approximately 150 nm, less than approximately 100 nm, less than approximately 50 nm, or less than approximately 25 nm, including ranges between any of the foregoing values, although precursor powders having a larger average particle size may be used.

In some embodiments, the milled powders may be calcined for a period of approximately 1 hr to approximately 24 hr, e.g., 1, 2, 4, 10, 15, 20 or 24 hr, at a temperature ranging from approximately 300° C. to approximately 1000° C., e.g., 300° C., 400° C., 500° C., 600° C., 700° C., 800° C., 900° C. or 1000° C., including ranges between any of the foregoing values. Calcination may be performed in an oxidizing environment, for example, and may be used to remove unwanted impurities, including organic impurities such as carbon.

According to various embodiments, a powder mixture may be compacted into a pellet or dispersed in a liquid and cast into a thin film to produce a desired form factor. For instance, a powder mixture may be compacted by applying a uniaxial pressure of approximately 10 MPa to approximately 500 MPa, e.g., 10, 15, 20, 25, 30, 50, 100, 200, 300, 400, or 500 MPa, including ranges between any of the foregoing values.

According to some embodiments, textured electroactive ceramics may be prepared by a templated grain growth (TGG) process, where seed crystals (or templates) may be aligned in a ceramic matrix powder, e.g., using tape casting. Additional alignment techniques include the exposure to a magnetic or electric field. Subsequent sintering may induce the nucleation and growth of matrix crystals on aligned templates forming an electroactive ceramic having a preferred crystallographic orientation. Example seed crystals may include $SrTiO_3$, $BaTiO_3$, PMN-PT, PZT, PIN-PMN-PT, etc., which may or may not be compositionally matched with the target composition of the electroactive ceramic.

The shaped bodies may be sintered. In some embodiments, the sintering temperature may range from approximately 750° C. to approximately 1400° C., e.g., 750° C., 800° C., 900° C., 1000° C., 1100° C., 1200° C., 1300° C., or 1400° C., including ranges between any of the foregoing values. In certain embodiments, the powders may be sintered in a controlled atmosphere, such as an oxidizing atmosphere, a reducing atmosphere, or under vacuum. In certain embodiments, pressure, e.g., uniaxial pressure, may be applied during sintering. Example sintering processes include conventional sintering, spark plasma sintering, or sintering using microwaves.

According to some embodiments, the sintered ceramic may be heated, e.g., under oxidizing or reducing conditions, to adjust the oxygen stoichiometry. Such a post-sintering anneal may be performed under vacuum or at approximately atmospheric pressure. In some embodiments, during a post-sinter heating step, the ceramic may be annealed within a bed of the precursor powder mixture, which may inhibit the evaporation of lead. In various embodiments, the densified ceramic may be ground, lapped and/or polished to achieve a smooth surface. In example embodiments, a transparent and textured electroactive ceramic may have a surface roughness of less than approximately 50 nm and exhibit less than 10% haze.

In an example method, magnesium oxide and niobium oxide powders may be ball milled in ethanol and calcined at 300° C.-1000° C. for 1 to 24 hr. To inhibit the formation of non-perovskite phases, lead oxide and titanium oxide powders may be added following the foregoing calcination step, and the mixture may then be ball milled in ethanol and calcined at 500° C.-1200° C. for 0.5 to 12 hr. Following the second calcination step, the powder mixture may be milled, compacted under a uniaxial pressure of 10-500 MPa and, while maintaining the applied pressure, sintered by spark plasma sintering at 750° C-1150° C. In some embodiments, the sintered ceramic may be heated to 400° C-1400° C. for 2-24 hr in an oxidizing environment. Following sintering, the lead zirconium magnesium titanate ceramic composition may have a relative density greater than approximately 99%, an average grain size of less than approximately 200 nm, and a distribution of crystal orientations having a full width half maximum of less than approximately 20°.

In a further example method, $Pb(OH)_2$, $MgNb_2O_6$, and $TiO_2$ powders may be mixed together, and then subsequently mixed with between 1 and 10% by volume of $SrTiO_3$ microplatelets. The resulting powder mixture may be tape cast. Shear forces associated with tape casting may align the microplatelets, i.e., perpendicular to the casting direction. The cast layer may be cut to shape, stacked, and laminated to create a green body.

Following a heating step to remove binder, green body tapes may be placed in a bed of powder of identical composition to limit lead loss during sintering. In some embodiments, the green body tapes may be hot pressed in argon or oxygen to achieve a dense and highly oriented sample. In some embodiments, the green body tapes may be first hot pressed in argon and subsequently annealed in an oxygen-rich environment.

According to a further example method, a two-step "columbite" process may be used to calcine $Pb_3O_4$, $Nb_2O_5$, MgO, $In_2O_3$, and $TiO_2$ powders. With the exception of lead oxide, the powders may be mixed in stoichiometric amounts. Excess lead oxide may be used to account for lead loss during sintering. After calcining, the PIN-PMN-PT mixture may be milled and mixed with between 1 and 10% by volume of $BaTiO_3$ microplatelets. The resulting mixture may be tape cast, which can induce alignment of the microplatelets perpendicular to the casting direction. The cast layer may be cut to shape, stacked, and laminated to create a green body.

Following a heating step to remove binder, green body tapes may be placed in a bed of powder of identical composition to limit lead loss during sintering. In some embodiments, sintering may be performed in a closed crucible. In further embodiments, sintering may be performed in an oxygen-rich environment.

In a still further example method, $Pb(OH)_2$, $MgNb_2O_6$, and $TiO_2$ powders may be mixed together, and then subsequently mixed with between 1 and 10% by volume of $PbTiO_3$ microplatelets. A powder sheet may be formed by tape casting, and exposure of the powder sheet to a magnetic field may be used to preferentially orient the platelets.

Following tape casting and platelet alignment, the cast layers may be cut to shape, stacked, and laminated to create a green body. After binder burnout, green body tapes may be placed in a bed of powder of identical composition to limit lead stoichiometry changes during sintering. In some embodiments, the green body tapes may be hot pressed in argon or oxygen to achieve a dense and highly oriented sample. In some embodiments, the green body tapes may be first hot pressed in argon and subsequently annealed in an oxygen-rich environment.

In some embodiments, a ceramic powder may be derived from a solution of one or more salts, chelates, and/or coordination complexes of, for example, lead, zirconium, and titanium, although further or alternate metal compounds may be used. The solution may be distilled, evaporated, and dried to form a compositionally homogeneous powder mixture. The powder mixture may be milled to an average particle size of less than approximately 300 nm, calcined to remove residual carbon, compacted, and sintered to form a dense, transparent, crystallographically-oriented electroactive ceramic having an average grain size of less than 200 nm, and a relative density of at least 99%.

As disclosed herein, an optically transparent actuator may include a pair of transparent electrodes and a layer of an electroactive ceramic disposed between the electrodes. Under a sufficiently high applied field, the electroactive ceramic layer may undergo a phase transformation and an accompanying realignment of domains along one or more polar orientations. Relative to randomly-oriented ceramics that exhibit electric field-induced scattering and an associated decrease in transmissivity and increase in haze, the disclosed phase transformation ceramics may exhibit a decreased birefringence, which beneficially impacts their optical properties. As such, the transmissivity, optical clarity, and haze characteristics of the phase transformation ceramics may present a high optical quality layer and an attendant E-field induced improvement in one or more of the foregoing characteristics. For instance, an example ceramic layer may exhibit a decrease in haze of at least 25% under applied fields of 0.5 MV/m and greater. The electroactive ceramic layers may be formed via powder processing, including powder modification (e.g. milling to achieve a sub-micron particle size), calcination, TGG seeding green body formation, and high temperature sintering. The ceramic may include a ferroelectric composition, such as a lead zirconate titanate (PZT)-based material, or another perovskite ceramic.

In particular embodiments, in contrast to many conventional actuator applications where it is common to orient and pole the ceramic along a non-polar axis to achieve the desired actuator performance, the disclosed electroactive ceramics may be oriented and poled along a polar axis, which may be used to simultaneously achieve beneficial displacement and optical properties. That is, as the misorientation angle between adjacent grains is decreased, the magnitude of the refractive index difference that light experiences while traversing the textured ceramic is also decreased, which may improve the optical quality of the material. Example Embodiments Example 1: An optical element includes a primary electrode, a secondary electrode overlapping at least a portion of the primary electrode, and an electroactive ceramic disposed between and abutting the primary electrode and the secondary electrode, wherein the primary electrode and the secondary electrode are each oriented perpendicular to a non-polar direction of the electroactive ceramic.

Example 2: The optical element of Example 1, where the electroactive ceramic includes a rhombohedral phase and each of the primary electrode and the secondary electrode are oriented perpendicular to a <110> crystallographic direction of the rhombohedral phase or a <100> crystallographic direction of the rhombohedral phase.

Example 3: The optical element of Example 1, where the electroactive ceramic includes an orthorhombic phase and each of the primary electrode and the secondary electrode are oriented perpendicular to a <111> crystallographic direction of the orthorhombic phase or a <100> crystallographic direction of the orthorhombic phase.

Example 4: The optical element Example 1, where the electroactive ceramic includes a tetragonal phase and each of the primary electrode and the secondary electrode are oriented perpendicular to a <111> crystallographic direction of the tetragonal phase or a <110> crystallographic direction of the tetragonal phase.

Example 5: The optical element of any of Examples 1-4, where the electroactive ceramic includes a transmissivity within the visible spectrum of at least approximately 50% and less than approximately 10% bulk haze.

Example 6: The optical element of any of Examples 1-5, where the electroactive ceramic, when exposed to an applied field of at least approximately 0.5 MV/m, may be characterized by at least one of (a) an optical transmissivity within the visible spectrum of at least approximately 50%, (b) bulk haze of less than approximately 50%, and (c) optical clarity of at least approximately 75%.

Example 7: The optical element of any of Examples 1-6, where the electroactive ceramic, when exposed to an applied field of at least approximately 0.5 MV/m, may be characterized by at least one of (a) a relative increase in optical transmissivity of at least approximately 10% (b) a relative decrease in bulk haze of at least approximately 25%, and (c) a relative increase in optical clarity of at least approximately 10%.

Example 8: The optical element of any of Examples 1-7, where the electroactive ceramic, when exposed to an applied field of at least approximately 0.5 MV/m, undergoes at least one phase transformation selected from (a) rhombohedral to orthorhombic, (b) rhombohedral to tetragonal, (c) orthorhombic to rhombohedral, (d) orthorhombic to tetragonal, (e) tetragonal to rhombohedral, and (f) tetragonal to orthorhombic.

Example 9: The optical element of any of Examples 1-8, where the electroactive ceramic includes a rhombohedral crystal structure having a preferred <111> orientation.

Example 10: The optical element of any of Examples 1-8, where the electroactive ceramic includes an orthorhombic or monoclinic crystal structure having a preferred <110> orientation.

Example 11: The optical element of any of Examples 1-8, where the electroactive ceramic includes a tetragonal crystal structure having a preferred <100> orientation.

Example 12: The optical element of any of Examples 1-11, where the electroactive includes at least one compound selected from lead titanate, lead zirconate, lead zirconate titanate, lead magnesium niobate, lead zinc niobate, lead indium niobate, lead magnesium tantalate, lead magnesium niobate-lead titanate, lead zinc niobate-lead titanate, lead indium tantalate, barium titanate, lithium niobate, potassium niobate, sodium potassium niobate, bismuth sodium titanate, and bismuth ferrite.

Example 13: The optical element of any of Examples 1-12, where the electroactive ceramic may be characterized by an RMS surface roughness of less than approximately 5 nm.

Example 14: The optical element of any of Examples 1-13, where the electroactive ceramic consists essentially of a perovskite ceramic.

Example 15: The optical element of any of Examples 1-14, where the electroactive ceramic exhibits at least a 25% increase in transparency, at least a 25% increase in clarity, and at least a 25% decrease in bulk haze when a voltage is applied to the primary electrode.

Example 16: A device including the optical element of any of Examples 1-15.

Example 17: An optical element includes a primary transparent electrode, a secondary transparent electrode overlapping at least a portion of the primary transparent electrode, and a transparent electroactive ceramic layer disposed between and abutting the primary transparent electrode and the secondary transparent electrode, wherein the electroactive ceramic layer may be characterized by a plurality of domains in the absence of an applied voltage between the electrodes and a single domain when a voltage is applied between the electrodes.

Example 18: A method includes forming a primary electrode, forming an electroactive ceramic layer over and abutting the primary electrode, forming a secondary electrode over and abutting the electroactive ceramic layer and overlapping at least a portion of the primary electrode, and applying a voltage to the primary electrode, wherein the electroactive ceramic layer may be characterized by (a) a first bulk haze and a first optical clarity prior to applying the voltage, and (b) a second bulk haze less than the first bulk haze and a second optical clarity greater than the first optical clarity during application of the voltage.

Example 19: The method of Example 18, where applying the voltage induces a rotation of domains within the electroactive ceramic layer.

Example 20: The method of any of Examples 18 and 19, where applying the voltage induces a phase change within the electroactive ceramic layer.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

FIG. 17 is a diagram of a head-mounted display (HMD) 1700 according to some embodiments. The HMD 1700 may include a lens display assembly, which may include one or more display devices. The depicted embodiment includes a left lens display assembly 1710A and a right lens display assembly 1710B, which are collectively referred to as lens display assembly 1710. The lens display assembly 1710 may be located within a transparent aperture of the HMD 1700 and configured to present media to a user.

Examples of media presented by the lens display assembly 1710 include one or more images, a series of images (e.g., a video), audio, or some combination thereof. In some embodiments, audio may be presented via an external device (e.g., speakers and/or headphones) that receives audio information from the lens display assembly 1710, a console (not shown), or both, and presents audio data based on the audio information. The lens display assembly 1710 may generally be configured to operate as an augmented reality near-eye display (NED), such that a user can see media projected by the lens display assembly 1710 and also see the real-world environment through the lens display assembly 1710. However, in some embodiments, the lens display assembly 1710 may be modified to operate as a virtual reality NED, a mixed reality NED, or some combination thereof. Accordingly, in some embodiments, the lens display assembly 1710 may augment views of a physical, real-world environment with computer-generated elements (e.g., images, video, sound, etc.).

The HMD 1700 shown in FIG. 17 may include a support or frame 1705 that secures the lens display assembly 1710 in place on the head of a user, in embodiments in which the lens display assembly 1710 includes separate left and right displays. In some embodiments, the frame 1705 may be a frame of eyewear glasses. As is described herein in greater detail, the lens display assembly 1710, in some examples, may include a waveguide with holographic or volumetric Bragg gratings. In some embodiments, the gratings may be generated by a process of applying one or more dopants or photosensitive media to predetermined portions of the surface of the waveguide and subsequent ultraviolet (UV) light exposure or application of other activating electromagnetic radiation.

Artificial-reality systems may be implemented in a variety of different form factors and configurations. Some artificial reality systems may be designed to work without near-eye displays (NEDs), an example of which is augmented-reality system 2600 in FIG. 26. Other artificial reality systems may include a NED that also provides visibility into the real world (e.g., augmented-reality system 2700 in FIG. 27) or that visually immerses a user in an artificial reality (e.g., virtual-reality system 2800 in FIG. 28). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 26:
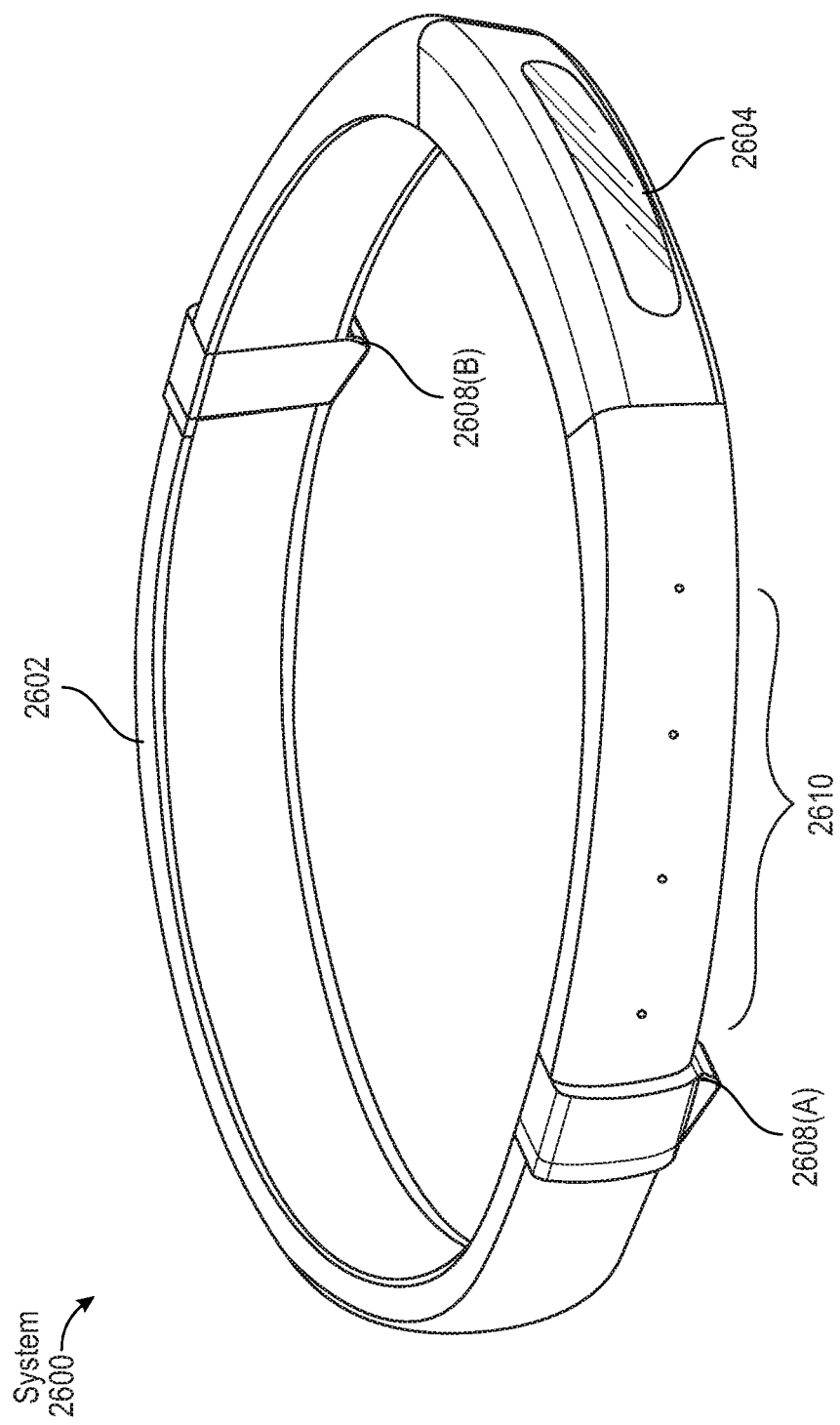
FIG. 26 is an illustration of an exemplary artificial-reality headband that may be used in connection with embodiments of this disclosure.

Turning to FIG. 26, augmented-reality system 2600 generally represents a wearable device dimensioned to fit about a body part (e.g., a head) of a user. As shown in FIG. 26, system 2600 may include a frame 2602 and a camera assembly 2604 that is coupled to frame 2602 and configured to gather information about a local environment by observing the local environment. Augmented-reality system 2600 may also include one or more audio devices, such as output audio transducers 2608(A) and 2608(B) and input audio transducers 2610. Output audio transducers 2608(A) and 2608(B) may provide audio feedback and/or content to a user, and input audio transducers 2610 may capture audio in a user's environment.

As shown, augmented-reality system 2600 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2600 may not include a NED, augmented-reality system 2600 may include other types of screens or visual feedback devices (e.g., a display screen integrated into a side of frame 2602).

Figure 27:
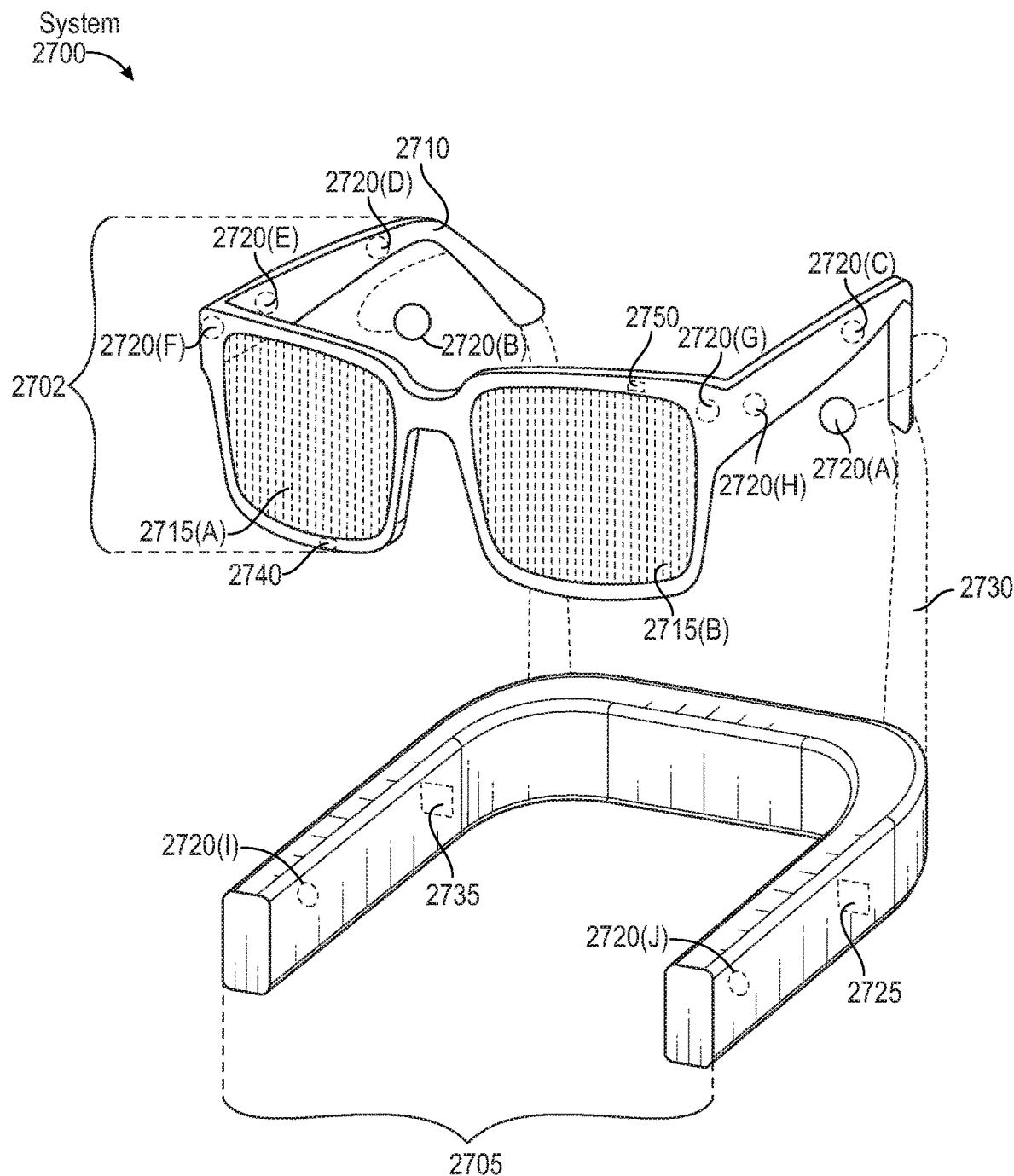
FIG. 27 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 27, augmented-reality system 2700 may include an eyewear device 2702 with a frame 2710 configured to hold a left display device 2715(A) and a right display device 2715(B) in front of a user's eyes. Display devices 2715(A) and 2715(B) may act together or independently to present an image or series of images to a user. While augmented-reality system 2700 includes two displays, embodiments of this disclosure may be implemented in augmented-reality systems with a single NED or more than two NEDs.

In some embodiments, augmented-reality system 2700 may include one or more sensors, such as sensor 2740. Sensor 2740 may generate measurement signals in response to motion of augmented-reality system 2700 and may be located on substantially any portion of frame 2710. Sensor 2740 may represent a position sensor, an inertial measurement unit (IMU), a depth camera assembly, or any combination thereof. In some embodiments, augmented-reality system 2700 may or may not include sensor 2740 or may include more than one sensor. In embodiments in which sensor 2740 includes an IMU, the IMU may generate calibration data based on measurement signals from sensor 2740. Examples of sensor 2740 may include, without limitation, accelerometers, gyroscopes, magnetometers, other suitable types of sensors that detect motion, sensors used for error correction of the IMU, or some combination thereof.

Augmented-reality system 2700 may also include a microphone array with a plurality of acoustic transducers 2720(A)-2720(J), referred to collectively as acoustic transducers 2720. Acoustic transducers 2720 may be transducers that detect air pressure variations induced by sound waves. Each acoustic transducer 2720 may be configured to detect sound and convert the detected sound into an electronic format (e.g., an analog or digital format). The microphone array in FIG. 27 may include, for example, ten acoustic transducers: 2720(A) and 2720(B), which may be designed to be placed inside a corresponding ear of the user, acoustic transducers 2720(C), 2720(D), 2720(E), 2720(F), 2720(G), and 2720(H), which may be positioned at various locations on frame 2710, and/or acoustic transducers 2720(I) and 2720(J), which may be positioned on a corresponding neckband 2705.

In some embodiments, one or more of acoustic transducers 2720(A)-(F) may be used as output transducers (e.g., speakers). For example, acoustic transducers 2720(A) and/or 2720(B) may be earbuds or any other suitable type of headphone or speaker.

The configuration of acoustic transducers 2720 of the microphone array may vary. While augmented-reality system 2700 is shown in FIG. 27 as having ten acoustic transducers 2720, the number of acoustic transducers 2720 may be greater or less than ten. In some embodiments, using higher numbers of acoustic transducers 2720 may increase the amount of audio information collected and/or the sensitivity and accuracy of the audio information. In contrast, using a lower number of acoustic transducers 2720 may decrease the computing power required by the controller 2750 to process the collected audio information. In addition, the position of each acoustic transducer 2720 of the microphone array may vary. For example, the position of an acoustic transducer 2720 may include a defined position on the user, a defined coordinate on frame 2710, an orientation associated with each acoustic transducer, or some combination thereof.

Acoustic transducers 2720(A) and 2720(B) may be positioned on different parts of the user's ear, such as behind the pinna or within the auricle or fossa. Or, there may be additional acoustic transducers on or surrounding the ear in addition to acoustic transducers 2720 inside the ear canal. Having an acoustic transducer positioned next to an ear canal of a user may enable the microphone array to collect information on how sounds arrive at the ear canal. By positioning at least two of acoustic transducers 2720 on either side of a user's head (e.g., as binaural microphones), augmented-reality device 2700 may simulate binaural hearing and capture a 3D stereo sound field around about a user's head. In some embodiments, acoustic transducers 2720(A) and 2720(B) may be connected to augmented-reality system 2700 via a wired connection 2730, and in other embodiments, acoustic transducers 2720(A) and 2720(B) may be connected to augmented-reality system 2700 via a wireless connection (e.g., a Bluetooth connection). In still other embodiments, acoustic transducers 2720(A) and 2720(B) may not be used at all in conjunction with augmented-reality system 2700.

Acoustic transducers 2720 on frame 2710 may be positioned along the length of the temples, across the bridge, above or below display devices 2715(A) and 2715(B), or some combination thereof. Acoustic transducers 2720 may be oriented such that the microphone array is able to detect sounds in a wide range of directions surrounding the user wearing the augmented-reality system 2700. In some embodiments, an optimization process may be performed during manufacturing of augmented-reality system 2700 to determine relative positioning of each acoustic transducer 2720 in the microphone array.

In some examples, augmented-reality system 2700 may include or be connected to an external device (e.g., a paired device), such as neckband 2705. Neckband 2705 generally represents any type or form of paired device. Thus, the following discussion of neckband 2705 may also apply to various other paired devices, such as charging cases, smart watches, smart phones, wrist bands, other wearable devices, hand-held controllers, tablet computers, laptop computers and other external compute devices, etc.

As shown, neckband 2705 may be coupled to eyewear device 2702 via one or more connectors. The connectors may be wired or wireless and may include electrical and/or non-electrical (e.g., structural) components. In some cases, eyewear device 2702 and neckband 2705 may operate independently without any wired or wireless connection between them. While FIG. 27 illustrates the components of eyewear device 2702 and neckband 2705 in example locations on eyewear device 2702 and neckband 2705, the components may be located elsewhere and/or distributed differently on eyewear device 2702 and/or neckband 2705. In some embodiments, the components of eyewear device 2702 and neckband 2705 may be located on one or more additional peripheral devices paired with eyewear device 2702, neckband 2705, or some combination thereof.

Pairing external devices, such as neckband 2705, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2700 may be provided by a paired device or shared between a paired device and an eyewear device, thus reducing the weight, heat profile, and form factor of the eyewear device overall while still retaining desired functionality. For example, neckband 2705 may allow components that would otherwise be included on an eyewear device to be included in neckband 2705 since users may tolerate a heavier weight load on their shoulders than they would tolerate on their heads. Neckband 2705 may also have a larger surface area over which to diffuse and disperse heat to the ambient environment. Thus, neckband 2705 may allow for greater battery and computation capacity than might otherwise have been possible on a stand-alone eyewear device. Since weight carried in neckband 2705 may be less invasive to a user than weight carried in eyewear device 2702, a user may tolerate wearing a lighter eyewear device and carrying or wearing the paired device for greater lengths of time than a user would tolerate wearing a heavy standalone eyewear device, thereby enabling users to more fully incorporate artificial reality environments into their day-to-day activities.

Neckband 2705 may be communicatively coupled with eyewear device 2702 and/or to other devices. These other devices may provide certain functions (e.g., tracking, localizing, depth mapping, processing, storage, etc.) to augmented-reality system 2700. In the embodiment of FIG. 27, neckband 2705 may include two acoustic transducers (e.g., 2720(I) and 2720(J)) that are part of the microphone array (or potentially form their own microphone subarray). Neckband 2705 may also include a controller 2725 and a power source 2735.

Acoustic transducers 2720(I) and 2720(J) of neckband 2705 may be configured to detect sound and convert the detected sound into an electronic format (analog or digital). In the embodiment of FIG. 27, acoustic transducers 2720(I) and 2720(J) may be positioned on neckband 2705, thereby increasing the distance between the neckband acoustic transducers 2720(I) and 2720(J) and other acoustic transducers 2720 positioned on eyewear device 2702. In some cases, increasing the distance between acoustic transducers 2720 of the microphone array may improve the accuracy of beamforming performed via the microphone array. For example, if a sound is detected by acoustic transducers 2720(C) and 2720(D) and the distance between acoustic transducers 2720(C) and 2720(D) is greater than, e.g., the distance between acoustic transducers 2720(D) and 2720(E), the determined source location of the detected sound may be more accurate than if the sound had been detected by acoustic transducers 2720(D) and 2720(E).

Controller 2725 of neckband 2705 may process information generated by the sensors on 2705 and/or augmented-reality system 2700. For example, controller 2725 may process information from the microphone array that describes sounds detected by the microphone array. For each detected sound, controller 2725 may perform a direction-of-arrival (DOA) estimation to estimate a direction from which the detected sound arrived at the microphone array. As the microphone array detects sounds, controller 2725 may populate an audio data set with the information. In embodiments in which augmented-reality system 2700 includes an inertial measurement unit, controller 2725 may compute all inertial and spatial calculations from the IMU located on eyewear device 2702. A connector may convey information between augmented-reality system 2700 and neckband 2705 and between augmented-reality system 2700 and controller 2725. The information may be in the form of optical data, electrical data, wireless data, or any other transmittable data form. Moving the processing of information generated by augmented-reality system 2700 to neckband 2705 may reduce weight and heat in eyewear device 2702, making it more comfortable to the user.

Power source 2735 in neckband 2705 may provide power to eyewear device 2702 and/or to neckband 2705. Power source 2735 may include, without limitation, lithium ion batteries, lithium-polymer batteries, primary lithium batteries, alkaline batteries, or any other form of power storage. In some cases, power source 2735 may be a wired power source. Including power source 2735 on neckband 2705 instead of on eyewear device 2702 may help better distribute the weight and heat generated by power source 2735.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2800 in FIG. 28, that mostly or completely covers a user's field of view. Virtual-reality system 2800 may include a front rigid body 2802 and a band 2804 shaped to fit around a user's head. Virtual-reality system 2800 may also include output audio transducers 2806(A) and 2806(B). Furthermore, while not shown in FIG. 28, front rigid body 2802 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 2800 and/or virtual-reality system 2800 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 2700 and/or virtual-reality system 2800 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2600, augmented-reality system 2700, and/or virtual-reality system 2800 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 26 and 28, output audio transducers 2608(A), 2608(B), 2806(A), and 2806(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2610 may include condenser microphones, dynamic microphones, ribbon microphones, and/or any other type or form of input transducer. In some embodiments, a single transducer may be used for both audio input and audio output.

Figure 28:
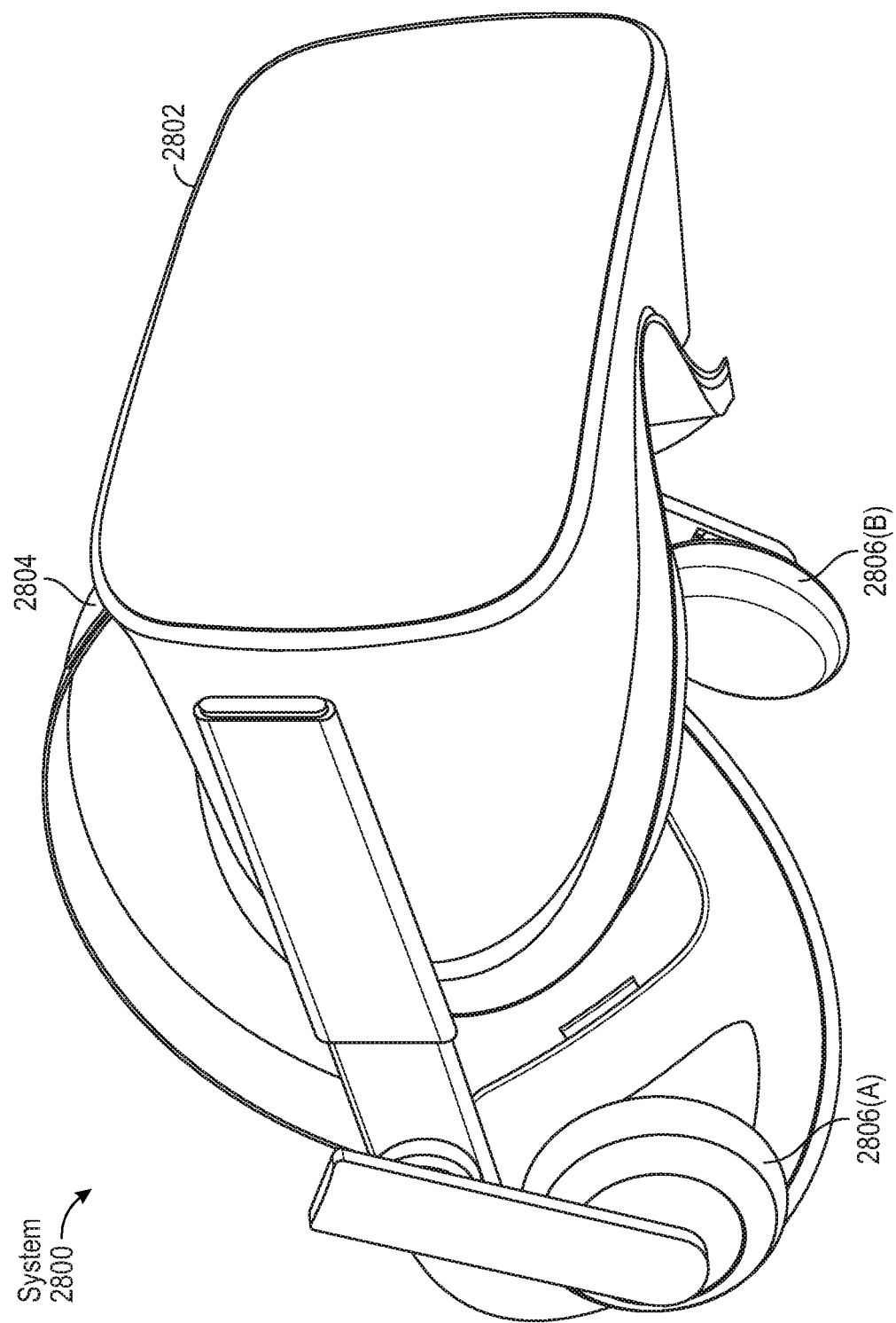
FIG. 28 is an illustration of an exemplary virtual-reality headset that may be used in connection with embodiments of this disclosure.

While not shown in FIGS. 26-28, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical element, comprising:
   a primary electrode layer;
   a secondary electrode layer overlapping at least a portion of the primary electrode layer;
   an electroactive ceramic disposed between and abutting the primary electrode layer and the secondary electrode layer, wherein:
      a top surface of the primary electrode layer and a bottom surface of the secondary electrode layer are each oriented perpendicular to a non-polar direction of the electroactive ceramic; and
      the electroactive ceramic, when exposed to an applied field of at least approximately 0.5 MV/m, comprises at least one of: an optical transmissivity within a visible spectrum of at least approximately 50%; bulk haze of less than approximately 50%;
   and optical clarity of at least approximately 75%; and
   a power source connected to at least one of the primary electrode layer or the secondary electrode layer.

2. The optical element of claim 1, wherein the electroactive ceramic comprises a rhombohedral phase and each of the primary electrode layer and the secondary electrode layer are oriented perpendicular to a <110>crystallographic direction of the rhombohedral phase or a <100>crystallographic direction of the rhombohedral phase.

3. The optical element of claim 1, wherein the electroactive ceramic comprises an orthorhombic phase and each of the primary electrode layer and the secondary electrode layer are oriented perpendicular to a <111>crystallographic direction of the orthorhombic phase or a <100>crystallographic direction of the orthorhombic phase.

4. The optical element of claim 1, wherein the electroactive ceramic comprises a tetragonal phase and each of the primary electrode layer and the secondary electrode layer are oriented perpendicular to a <111>crystallographic direction of the tetragonal phase or a <110>crystallographic direction of the tetragonal phase.

5. The optical element of claim 1, wherein the electroactive ceramic comprises a transmissivity within the visible spectrum of at least approximately 50% and less than approximately 10% bulk haze.

6. The optical element of claim 1, wherein the electroactive ceramic, when exposed to an applied field of at least approximately 0.5 MV/m, comprises at least one of:
   a relative increase in optical transmissivity of at least approximately 10%;
   a relative decrease in bulk haze of at least approximately 25%; and
   a relative increase in optical clarity of at least approximately 10%.

7. The optical element of claim 1, wherein the electroactive ceramic, when exposed to an applied field of at least approximately 0.5 MV/m, undergoes at least one phase transformation selected from a group consisting of:
   rhombohedral to orthorhombic;
   rhombohedral to tetragonal;
   orthorhombic to rhombohedral;
   orthorhombic to tetragonal;
   tetragonal to rhombohedral; and
   tetragonal to orthorhombic.

8. The optical element of claim 1, wherein the electroactive ceramic comprises a rhombohedral crystal structure having a preferred <111>orientation.

9. The optical element of claim 1, wherein the electroactive ceramic comprises an orthorhombic or monoclinic crystal structure having a preferred <110>orientation.

10. The optical element of claim 1, wherein the electroactive ceramic comprises a tetragonal crystal structure having a preferred <100>orientation.

11. The optical element of claim 1, wherein the electroactive ceramic comprises at least one compound selected from a group consisting of lead titanate, lead zirconate, lead zirconate titanate, lead magnesium niobate, lead zinc niobate, lead indium niobate, lead magnesium tantalate, lead magnesium niobate-lead titanate, lead zinc niobate-lead titanate, lead indium tantalate, barium titanate, lithium niobate, potassium niobate, sodium potassium niobate, bismuth sodium titanate, and bismuth ferrite.

12. The optical element of claim 1, wherein the electroactive ceramic comprises an RMS surface roughness of less than approximately 5 nm.

13. The optical element of claim 1, wherein the electroactive ceramic consists essentially of a perovskite ceramic.

14. The optical element of claim 1, wherein the electroactive ceramic comprises at least a 25% increase in transparency, at least a 25% increase in clarity, and at least a 25% decrease in bulk haze when a voltage is applied to the primary electrode layer.

15. A device comprising the optical element of claim 1.

16. An optical element, comprising:
   a primary transparent electrode layer;
   a secondary transparent electrode layer overlapping at least a portion of the primary transparent electrode layer;
   a transparent electroactive ceramic layer disposed between and abutting a top surface of the primary transparent electrode layer and a bottom surface of the secondary transparent electrode layer, wherein:
      the electroactive ceramic layer comprises a plurality of domains in an absence of an applied voltage between the electrode layers and a single domain when a voltage is applied between the electrode layers; and
      the electroactive ceramic layer, when exposed to an applied field of at least approximately 0.5 MV/m, comprises at least one of: an optical transmissivity within a visible spectrum of at least approximately 50%; bulk haze of less than approximately 50%;
   and optical clarity of at least approximately 75%; and
   a power source connected to at least one of the primary electrode layer or the secondary electrode layer.

17. A method comprising:
   forming a primary electrode layer;
   forming an electroactive ceramic layer over and abutting a top surface of the primary electrode layer, wherein the electroactive ceramic layer, when exposed to an applied field of at least approximately 0.5 MV/m, comprises at least one of: an optical transmissivity within a visible spectrum of at least approximately 50%; bulk haze of less than approximately 50%; an optical clarity of at least approximately 75%;

forming a secondary electrode layer, wherein a bottom surface of the secondary electrode layer is over and abutting the electroactive ceramic layer and overlapping at least a portion of the primary electrode layer; and applying a voltage to the primary electrode layer, wherein the electroactive ceramic layer comprises:

a first bulk haze and a first optical clarity prior to applying the voltage, and a second bulk haze less than the first bulk haze and a second optical clarity greater than the first optical clarity during application of the voltage.

18. The method of claim 17, wherein applying the voltage induces a rotation of domains within the electroactive ceramic layer.

19. The method of claim 17, wherein applying the voltage induces a phase change within the electroactive ceramic layer.

20. The method of claim 19, wherein inducing a phase change within the electroactive ceramic layer comprises undergoing at least one phase change selected from a group consisting of:

rhombohedral to orthorhombic;
rhombohedral to tetragonal;
orthorhombic to rhombohedral;
orthorhombic to tetragonal;
tetragonal to rhombohedral; and
tetragonal to orthorhombic.

* * * * *